(12) United States Patent
Nakamura et al.

(10) Patent No.: US 8,692,584 B2
(45) Date of Patent: Apr. 8, 2014

(54) SEMICONDUCTOR INTEGRATED CIRCUIT DEVICE

(75) Inventors: Takashi Nakamura, Kanagawa (JP); Kosuke Yayama, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 32 days.

(21) Appl. No.: 13/579,766

(22) PCT Filed: Feb. 19, 2010

(86) PCT No.: PCT/JP2010/052533
§ 371 (c)(1),
(2), (4) Date: Aug. 17, 2012

(87) PCT Pub. No.: WO2011/101981
PCT Pub. Date: Aug. 25, 2011

(65) Prior Publication Data
US 2012/0319738 A1     Dec. 20, 2012

(51) Int. Cl.
*H03C 3/00*          (2006.01)
(52) U.S. Cl.
USPC .......................................................... 327/101
(58) Field of Classification Search
USPC .................. 327/291, 294, 298, 101, 102
See application file for complete search history.

(56) References Cited

U.S. PATENT DOCUMENTS

| 5,495,193 | A  | * | 2/1996 | Nukui ........................... 327/101 |
| 7,106,109 | B2 | * | 9/2006 | Wu ................................ 327/101 |
| 7,332,944 | B2 | * | 2/2008 | Fujita et al. ................... 327/113 |

FOREIGN PATENT DOCUMENTS

| JP | 2002-300027 A | 10/2002 |
| JP | 2006-086997 A | 3/2006 |
| JP | 2007-318760 A | 12/2007 |
| JP | 2008-252414 A | 10/2008 |

* cited by examiner

*Primary Examiner* — Hai L Nguyen
(74) *Attorney, Agent, or Firm* — Mattingly & Malur, PC

(57) ABSTRACT

A frequency-voltage converting circuit 13 is composed of a switch unit including switches SW1 and SW2, electrostatic capacitive elements C and C10 to C13, and switches CSW0 to CSW3. The electrostatic capacitive elements C10 to C13 are composed of elements having mutually different absolute values of capacitance and are provided so as to cover a frequency range intended by a designer. The electrostatic capacitance values are weighted by, for example, 2. The electrostatic capacitive elements C11 to C13 are selected by, for example, the switches CSW0 to CSW3 based on 4-bit frequency adjustment control signals SELC0 to SELC3, thereby carrying out frequency switching.

13 Claims, 34 Drawing Sheets

NON-LINEAR COMPONENTS ARE FORMED IN VSIG WAVEFORM
DUE TO ON RESISTANCE OF SELECT SW ⇒ TEMPERATURE AND
POWER-SUPPLY DEPENDENCY IS CAUSED

FREQUENCY-VOLTAGE CONVERTING CIRCUIT

FREQUENCY-VOLTAGE CONVERTING CIRCUIT

FREQUENCY-VOLTAGE CONVERTING CIRCUIT

FREQUENCY-VOLTAGE CONVERTING CIRCUIT

SEMICONDUCTOR INTEGRATED CIRCUIT DEVICE

TECHNICAL FIELD

The present invention relates to techniques of generating a reference voltage used in an on-chip oscillator circuit, and particularly relates to techniques effectively applied to generation of a high-precision clock signal that is not affected by power fluctuation, temperature variation, and others.

BACKGROUND

In a semiconductor integrated circuit device such as a microcomputer, reduction of external parts is required for downsizing the equipment and reducing cost, and some of the semiconductor integrated circuit devices incorporate a clock generating circuit which generates a clock signal to be supplied to a CPU and peripheral function blocks.

A clock-signal generating circuit of this type is composed of, for example, an oscillator which generates clock signals and two frequency dividers which divide the frequency of the clock signals generated by the oscillator. The frequency dividers are provided in order to increase the options of clock frequencies by the combination of the number of frequency divisions.

Also, the oscillator is composed of, for example, a clock generating unit forming a feedback loop by a reference voltage generating circuit, a constant current generating circuit, a control circuit, a frequency-voltage converting circuit, an integrating circuit, and a voltage control oscillator.

The reference voltage generating circuit generates reference voltages VREFI and VREFC and outputs them to the constant current generating circuit and the integrating circuit. The constant current generating circuit generates a current Iref having no power-supply and temperature dependency. The frequency-voltage converting circuit generates a voltage VSIG based on the current Iref generated by the constant current generating circuit and a control signal generated by a capacitor and a control circuit.

The control circuit generates the control signal based on the clock signal generated by the voltage control oscillator circuit. The frequency-voltage converting circuit generates the voltage based on the current generated by the constant current generating circuit and the control signal generated by the capacitor and the control circuit from the clock signal output from the voltage control oscillator circuit.

The integrating circuit changes a control voltage of the voltage control oscillator so that the reference voltage VREFC generated by the reference voltage generating circuit and the voltage VSIG output from the frequency-voltage converting circuit are equal to each other to adjust the clock cycle to a desired frequency.

As a clock oscillator circuit of this type, the circuit has been known, in which a current control oscillator, a frequency divider, a cycle comparator circuit, an integrator, and a voltage-current converting circuit are connected in series, and an output current of the voltage-current converting circuit of the last stage is fed back to an input side of the current control oscillator of the first stage to make the output of the current control oscillator be an oscillation output, thereby stabilizing the oscillation frequency and improving the oscillation accuracy (see Patent Document 1).

PRIOR ART DOCUMENTS

Patent Documents

Patent Document 1: Japanese Unexamined Patent Application Publication No. 2002-300027

SUMMARY

Problems to be Solved by the Invention

However, the inventors of the present invention found out that the clock generating techniques of the clock generating circuit provided in the semiconductor integrated circuit device as described above have following problems.

FIG. 44 shows a basic configuration of a conventional on-chip oscillator. The on-chip oscillator is composed of a clock generating circuit forming a feedback loop by a reference voltage generating circuit 100, a constant current generating circuit 101, a control circuit 102, a frequency-voltage converting circuit 103, an integrating circuit 104, and a voltage control oscillator circuit 105.

An oscillating cycle T of a clock signal generated by the above-described clock generating circuit is expressed by the following expression (1) with a capacitor C incorporated in the voltage control oscillator circuit 105, a constant current component VREFI/R generated in the circuit, and a reference voltage VREFC.

The oscillating cycle T is maintained to be constant by controlling the ratio of the constant voltages VREFI and VREFC with respect to the capacitance C and resistance R which are constants.

[Expression 1]

$$T = \frac{C \cdot VREFC}{\frac{VREFI}{R}} \qquad \text{Expression (1)}$$

Operation of the circuit of FIG. 44 will be described.

The reference voltage generating circuit 100 generates reference voltages VREFC and VREFI and outputs the voltages to the constant current generating circuit 101 and the integrating circuit 104. The constant current generating circuit 101 generates, in the interior thereof, a constant current Iref having no power-supply and temperature dependency, converts the current to Iconst by a current mirror circuit, and outputs it to the frequency-voltage converting circuit.

The frequency-voltage converting circuit 103 generates a voltage VSIG by using the current Iconst output from the constant current generating circuit 101 and control signals ZCHR, DISC, and SAMP generated by the control circuit 102 from the clock of the voltage control oscillator circuit 105. The control signals ZCHR, DISC, and SAMP are signals having a pulse width which is equal to an output clock cycle.

The integrating circuit 104 samples the voltage VSIG and changes a control voltage VCNT of the voltage control oscillator circuit 105 so that the reference voltage VREFC having no power-supply and temperature dependency and the output voltage VSIG of the frequency-voltage converting circuit 103 are equal to each other to adjust the clock cycle to a desired frequency.

In the clock generating circuit, error factors caused by temperature characteristics of the elements constituting the circuit, variations of the circuit, and others are present as shown in Expression (2) with respect to Expression (1).

[Expression 2]

$$T = \frac{C(t) \cdot (1 + Cp2/C(t)) \cdot (VREFC + \Delta Vof2) + Cp1 \cdot \Delta V_{NDD}}{M \cdot \left(\frac{VREFI + \Delta Vof1}{R(t)}\right) \pm \Delta I_{mismatch} + Ioff} \quad \text{Expression (2)}$$

C(t) represents a capacitive element having temperature dependency with respect to an ideal capacitance C of Expression (1), and R(t) represents a resistive element having temperature dependency with respect to ideal R of Expression (1). M is a constant for a frequency switching function by a current mirror although not shown in Expression (1).

Error factors include following factors.

(1) There is ΔImismatch caused by, for example, a current-mirror threshold voltage mismatch or a current error induced by ΔVth, and this ΔImismatch serves as an error by being added to or subtracted from the current component of the denominator of Expression (1).

(2) A parasitic capacitance Cp1 at a terminal NDD which reaches the frequency-voltage converting circuit from the constant current generating circuit and a voltage variation ΔVNDD of the terminal serve as an error by being added to the component of the product of the capacitance and voltage of the numerator.

(3) A parasitic capacitance Cp2 connected to an output signal of the frequency-voltage converting circuit serves as an error by being added to an internal capacitance C(t) of the frequency-voltage converting circuit.

(4) A sub-threshold leakage Ioff of the current mirror serves as an error by being added to the current component of the denominator.

(5) Offset voltages Vof1 and Vof2 at the constant current generating circuit and an operational amplifier of the integrating circuit serve as an error by being added to the voltage components VREFI and VREFC of the denominator and the numerator, respectively.

The current error ΔImismatch of (1) is varied when the frequency is switched by a constant M, and it causes frequency variation. The frequency switching is a function incorporated when required depending on the specifications of a semiconductor integrated circuit device. However, when the frequency is switched, expected frequency accuracy may not be obtained, and problems such as influence on applications due to that may be caused.

As described above, in order to realize high frequency accuracy in clock signals, countermeasures to the error factors of Expression (2) have to be taken so as to realize a constant level of accuracy regardless of the frequency.

An object of the present invention is to provide techniques capable of generating high-precision clock signals even when power supply, temperature, and others are varied.

The above and other objects and novel characteristics of the present invention will be apparent from the description of the present specification and the accompanying drawings.

Means for Solving the Problem

The following is a brief description of an outline of the typical invention disclosed in the present application.

The present invention is a semiconductor integrated circuit device comprising: a clock oscillating unit, the clock oscillating unit including: a voltage control oscillator circuit that generates a clock signal based on a control voltage; a reference voltage generating circuit that generates a first reference voltage having temperature dependency and a second reference voltage having almost no power-supply and temperature dependency; a reference current generating circuit that generates a reference current having almost no power-supply and temperature dependency by using the first reference voltage generated by the reference voltage generating circuit; a frequency-voltage converting circuit that converts an oscillation frequency of the clock signal generated by the voltage control oscillator circuit to a voltage by using the reference current generated by the reference current generating circuit; and an integrating circuit that integrates the voltage output from the frequency-voltage converting circuit and generates the control voltage output to the voltage control oscillator circuit, and the frequency-voltage converting circuit including: first to Nth electrostatic capacitive units; a capacitor selecting unit that selects at least one of the second to Nth electrostatic capacitive units based on a select signal; and a switch unit that charges/discharges the first electrostatic capacitive unit and the electrostatic capacitive unit selected by the switch unit with the reference current based on a charge signal and a discharge signal.

Other outlines of the invention of the present application will be simply described below.

In the present invention, the second to Nth electrostatic capacitive units are composed of electrostatic capacitive elements having mutually different electrostatic capacitance values, respectively.

Also, in the present invention, the second to Nth electrostatic capacitive units are configured to have a mutually different number of electrostatic capacitive elements having approximately the same electrostatic capacitance value.

Furthermore, in the present invention, the switch unit is composed of: a first switch having one connecting part to which the reference current is supplied; and a second switch having one connecting part to which the other connecting part of the first switch is connected and having the other connecting part to which a reference potential is connected, the capacitor selecting unit is composed of: a plurality of capacitor selecting switches having one connecting parts to which a connecting part of the first switch and the second switch is connected and having the other connecting parts to which one connecting parts of the second to Nth electrostatic capacitive units are connected, respectively, the first electrostatic capacitive unit is configured to have one connecting part to which the connecting part of the first switch and the second switch is connected and have the other connecting part to which the reference potential is connected, and the reference potential is connected to the other connecting parts of the second to Nth electrostatic capacitive units.

Also, in the present invention, the switch unit is composed of: a first switch having one connecting part to which the reference current is supplied; and a second switch having one connecting part to which the other connecting part of the first switch is connected and having the other connecting part to which a reference potential is connected, the first to Nth electrostatic capacitive units have one connecting parts to which a connecting part of the first switch and the second switch is connected, the capacitor selecting unit is composed of a plurality of capacitor selecting switches having one connecting parts to which one connecting parts of the second to Nth electrostatic capacitive units are connected, respectively, and having the other connecting parts to which the reference potential is connected, and the other connecting part of the first electrostatic capacitive unit is connected to the reference potential.

Furthermore, in the present invention, the capacitor selecting unit has a reset unit that turns on the capacitor selecting switch, which is not selected, for an arbitrary period based on a reset signal when the discharge signal is output.

Also, in the present invention, the capacitor selecting switch is composed of two transistors connected in series.

Furthermore, in the present invention, the capacitor selecting unit and the switch unit are disposed on a side of a first side of the first to Nth electrostatic capacitive units or on a side of a second side opposed to the first side.

Also, in the present invention, the reference current generating circuit includes: a first transistor having one connecting part to which a power-supply voltage is connected; a first voltage dependency reducing transistor having one connecting part to which the other connecting part of the first transistor is connected; a resistor having one connecting part to which the other connecting part of the first voltage dependency reducing transistor is connected and having the other connecting part to which the reference potential is connected; an operational amplifier that uses the reference voltage as an input voltage and constitutes a voltage follower circuit together with the first transistor and the first voltage dependency reducing transistor; second to Nth transistors constituting a current mirror circuit together with the first transistor; second to Nth voltage dependency reducing transistors connected in series to the second to Nth transistors, respectively, and having mutually different transistor sizes; a transistor selecting unit that selects and turns on at least one of the second to Nth voltage dependency reducing transistors based on a transistor unit select signal, thereby switching a current mirror ratio; and a leakage current suppressing unit that is connected between a connecting part of the second to Nth transistors and the second to Nth voltage dependency reducing transistors and the reference potential and discharges the current of the voltage dependency reducing transistor, which is not selected by the transistor selecting unit, to the reference potential.

Furthermore, in the present invention, the reference current generating circuit includes a current source connected between the leakage current suppressing unit and the reference potential, and the current source controls a value of the current discharged from the leakage current suppressing unit.

Also, in the present invention, the reference voltage generating circuit includes: a first resistor unit having one connecting part to which a PTAT current having positive primary-temperature dependency is supplied and composed of a plurality of resistors connected in series; a bipolar transistor having a collector and a base to which the other connecting part of the first resistor unit is connected; a second resistor unit having one connecting part to which an emitter of the bipolar transistor is connected, having the other connecting part to which the reference potential is connected, and composed of a plurality of resistors connected in series; a third resistor unit having one connecting part to which the other connecting part of the first resistor unit is connected, having the other connecting part to which the reference potential is connected, and composed of a plurality of resistors connected in series; a first selecting unit that selects an arbitrary connecting part of the first resistor unit based on a first temperature trimming signal and outputs as the first reference voltage; a second selecting unit that selects an arbitrary connecting part of the third resistor unit based on a second temperature trimming signal and outputs as the second reference voltage; and an adjustment unit that adjusts a voltage dividing ratio at the second resistor unit based on an adjustment control signal to cancel out temperature dependency of a base-emitter voltage of the bipolar transistor.

Furthermore, in the present invention, the reference voltage generating circuit includes: a first resistor unit having one connecting part to which a PTAT current having positive primary temperature dependency is supplied and composed of a plurality of resistors connected in series; a bipolar transistor having a collector and a base to which the other connecting part of the first resistor unit is connected; a second resistor unit having one connecting part to which an emitter of the bipolar transistor is connected, having the other connecting part to which the reference potential is connected, and composed of a plurality of resistors connected in series; a transistor having one connecting part to which the power-supply voltage is connected; a third resistor unit having one connecting part to which the other connecting part of the transistor is connected, having the other connecting part to which the reference potential is connected, and composed of a plurality of resistors connected in series; an operational amplifier having a negative-side input terminal to which the collector and base of the bipolar transistor are connected, having a positive-side input terminal to which a midpoint of the third resistor unit is connected, and having an output part to which a gate of the transistor is connected; a first selecting unit that selects an arbitrary connecting part of the first resistor unit based on a first temperature trimming signal and outputs as the first reference voltage; a second selecting unit that selects an arbitrary connecting part of the third resistor unit based on a second temperature trimming signal and outputs as the second reference voltage; and an adjustment unit that adjusts a voltage dividing ratio of the second resistor unit based on an adjustment control signal to cancel out temperature dependency of a base-emitter voltage of the bipolar transistor.

Effects of the Invention

The effects obtained by typical embodiments of the invention disclosed in the present application will be briefly described below.

(1) Since frequency switching of a clock signal can be carried out by varying the electrostatic capacitance of a frequency-voltage converting circuit, high-precision clock signals can be generated.

(2) According to above-described (1), reliability of a semiconductor integrated circuit device can be improved.

DETAILED DESCRIPTION

Hereinafter, embodiments of the present invention will be described in detail with reference to the accompanying drawings. Note that components having the same function are denoted by the same reference symbols throughout the drawings for describing the embodiments, and the repetitive description thereof will be omitted.

First Embodiment

Figure 1:
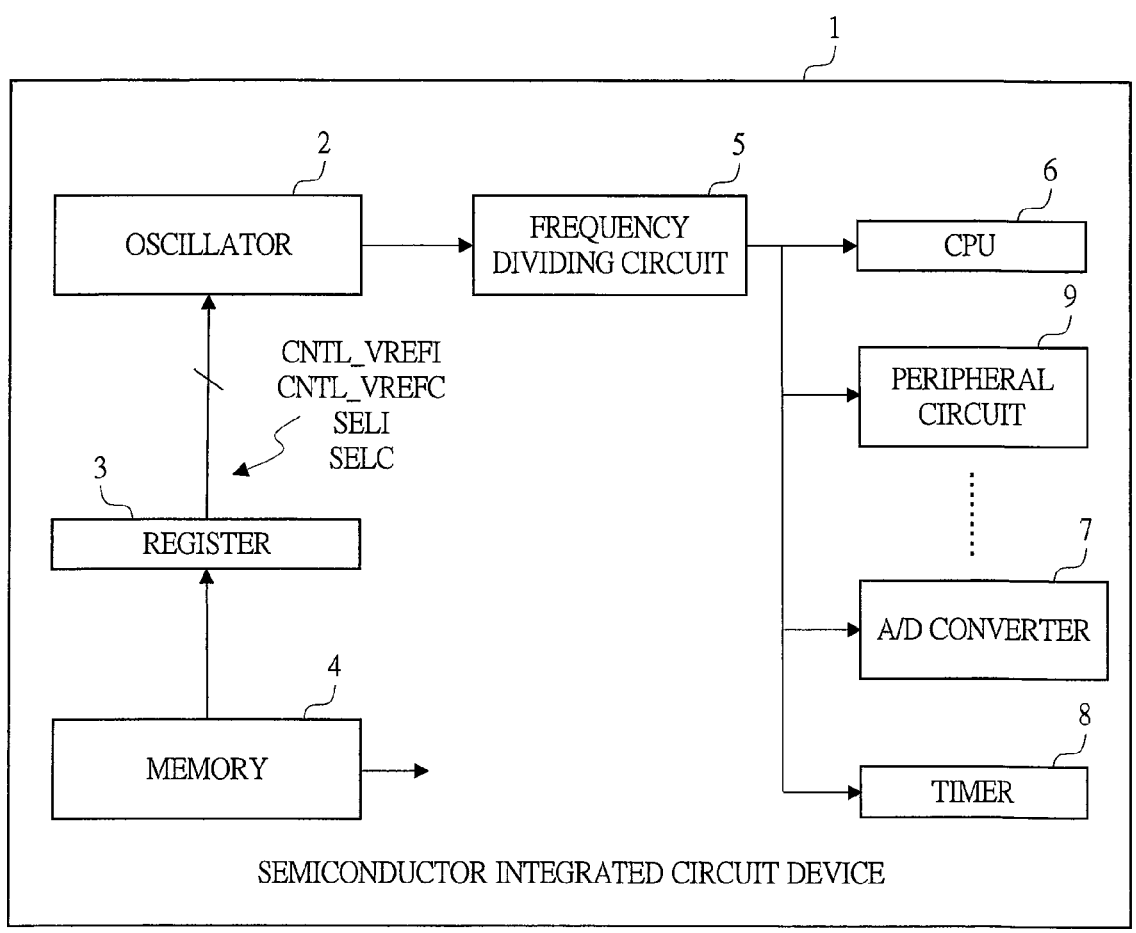
FIG. 1 is a block diagram showing a configuration example of a semiconductor integrated circuit device according to a first embodiment of the present invention.
Figure 2:
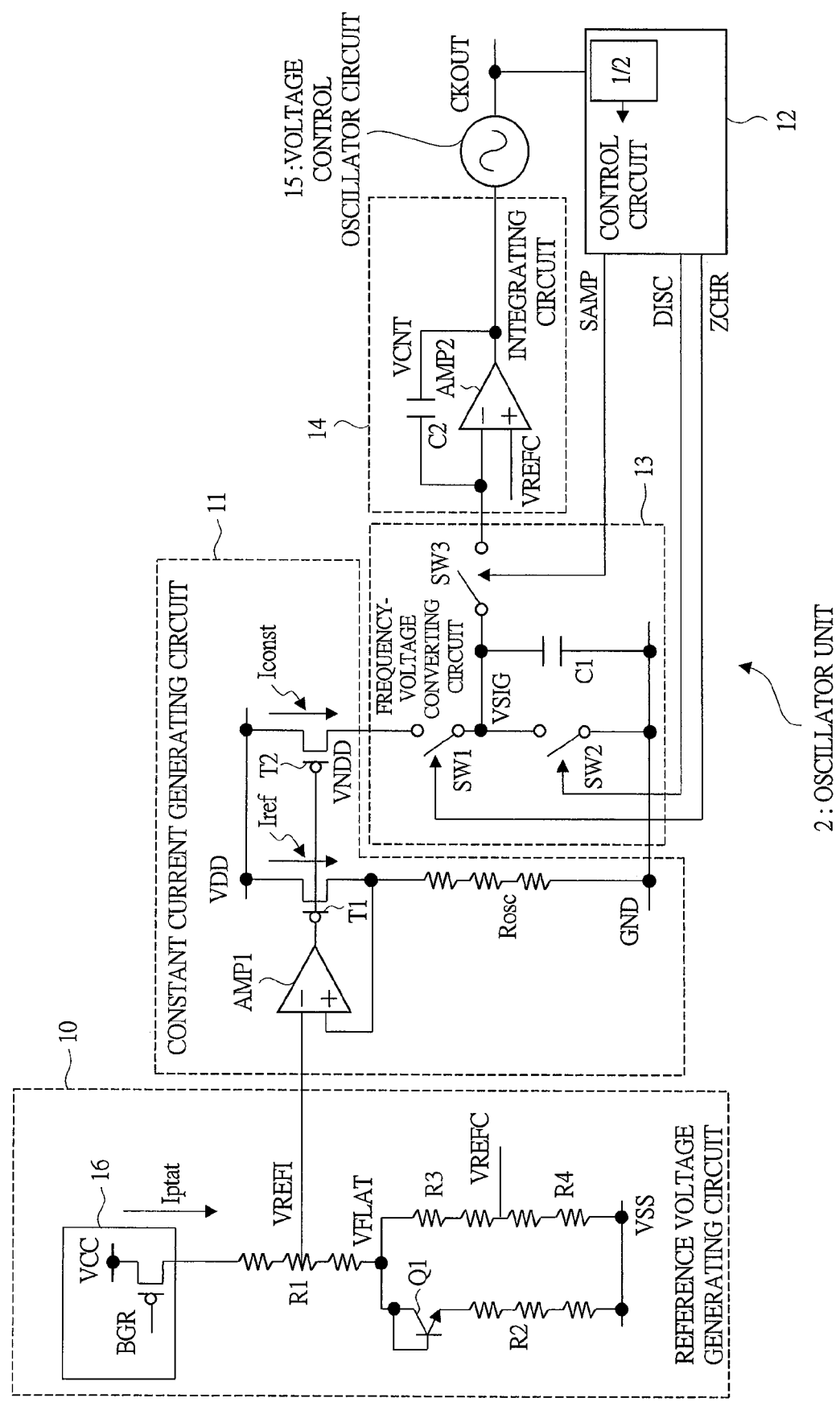
FIG. 2 is an explanatory diagram showing an example of the configuration of an oscillator unit provided in the semiconductor integrated circuit device of FIG. 1.
Figure 3:
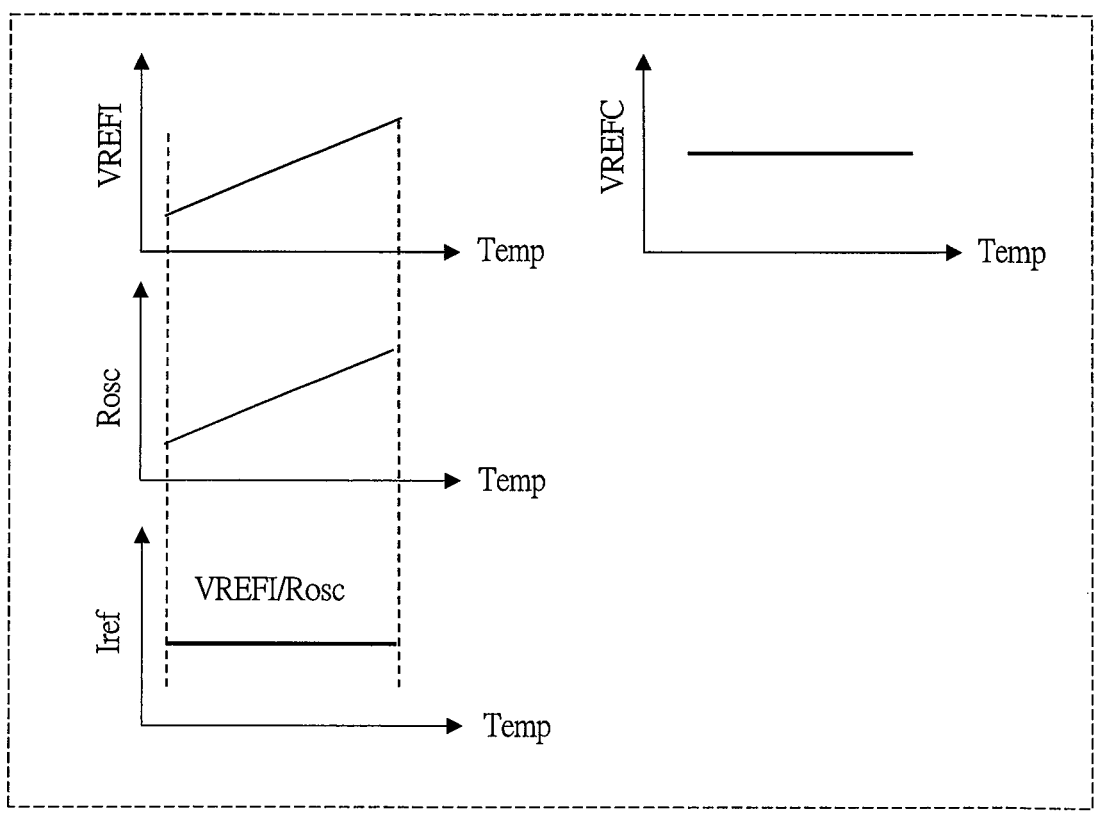
FIG. 3 is an explanatory drawing showing an example of the temperature dependency of the voltages generated by a reference voltage generating circuit provided in the oscillator unit of FIG. 2.
Figure 4:
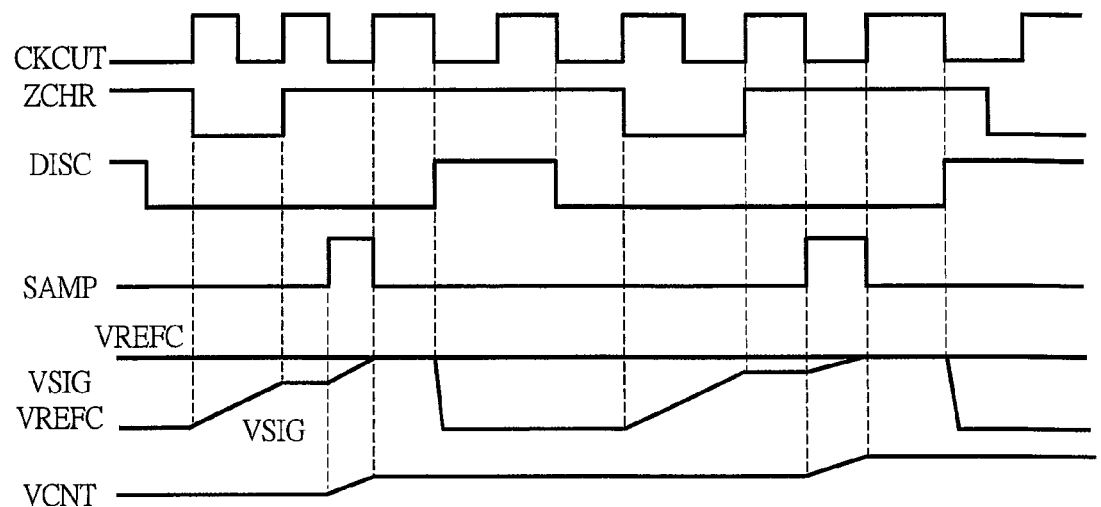
FIG. 4 is a timing chart showing an example of a process in which the oscillator unit of FIG. 2 adjusts a clock signal which is faster than an objective frequency.
Figure 5:
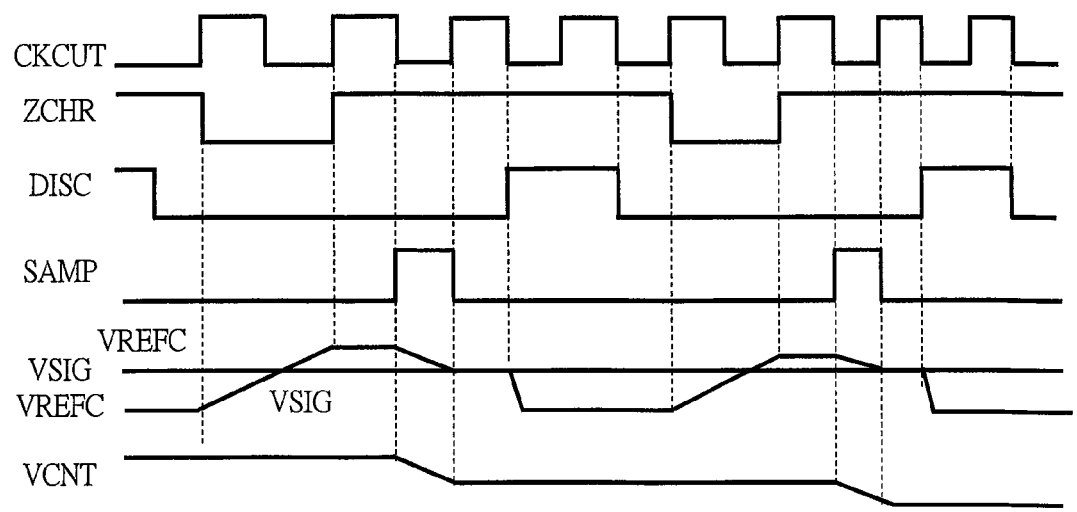
FIG. 5 is a timing chart showing an example of a process in which the oscillator unit of FIG. 2 adjusts a clock signal which is slower than an objective frequency.
Figure 6:
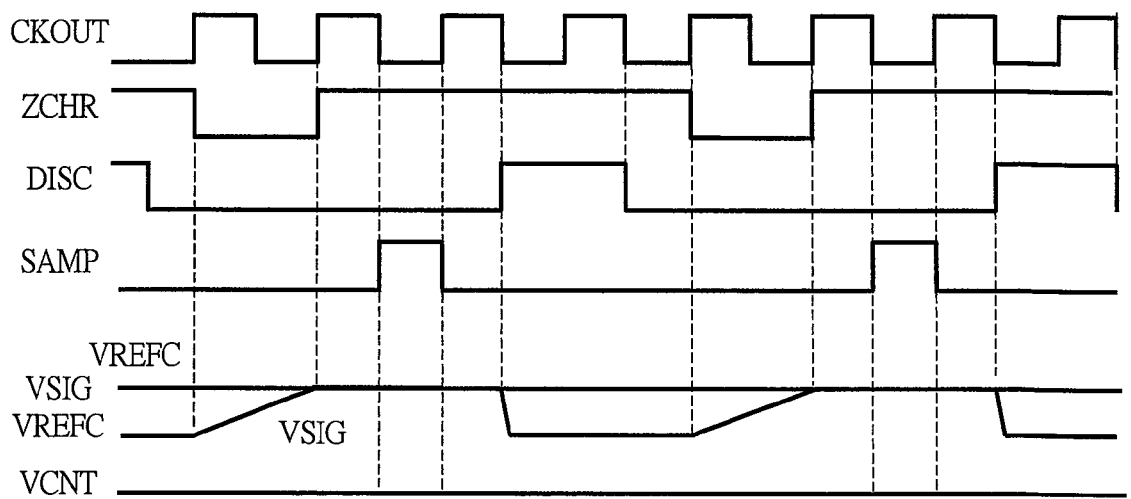
FIG. 6 is a timing chart showing an operation example of a case in which the oscillating frequency of the clock signal at the oscillator unit of FIG. 2 and an objective frequency match each other.
Figure 7:
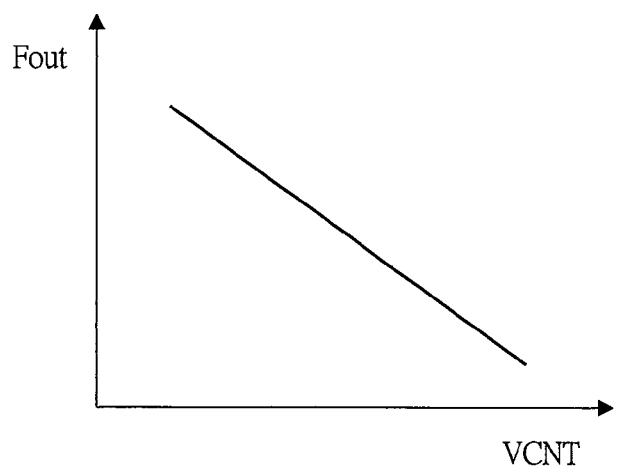
FIG. 7 is an explanatory drawing showing an example of VF characteristics of a voltage control oscillator circuit provided in the oscillator unit of FIG. 2.
Figure 8:
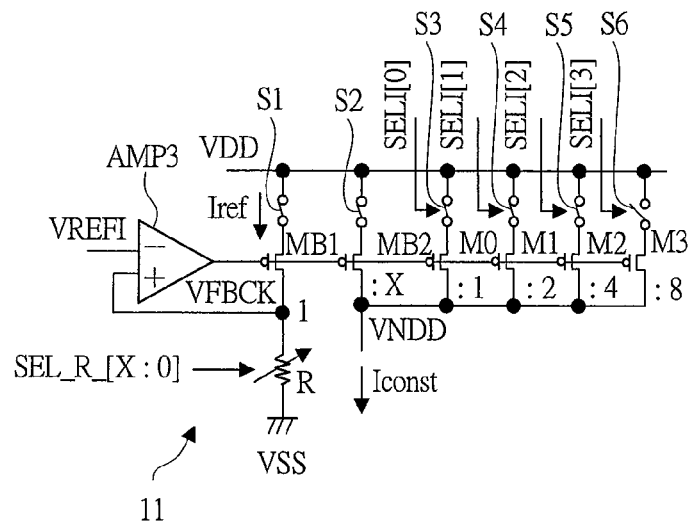
FIG. 8 is an explanatory drawing showing an example of a constant current generating circuit studied by the inventors of the present invention, which changes a current mirror ratio by a transistor size to carry out frequency switching.
Figure 9:
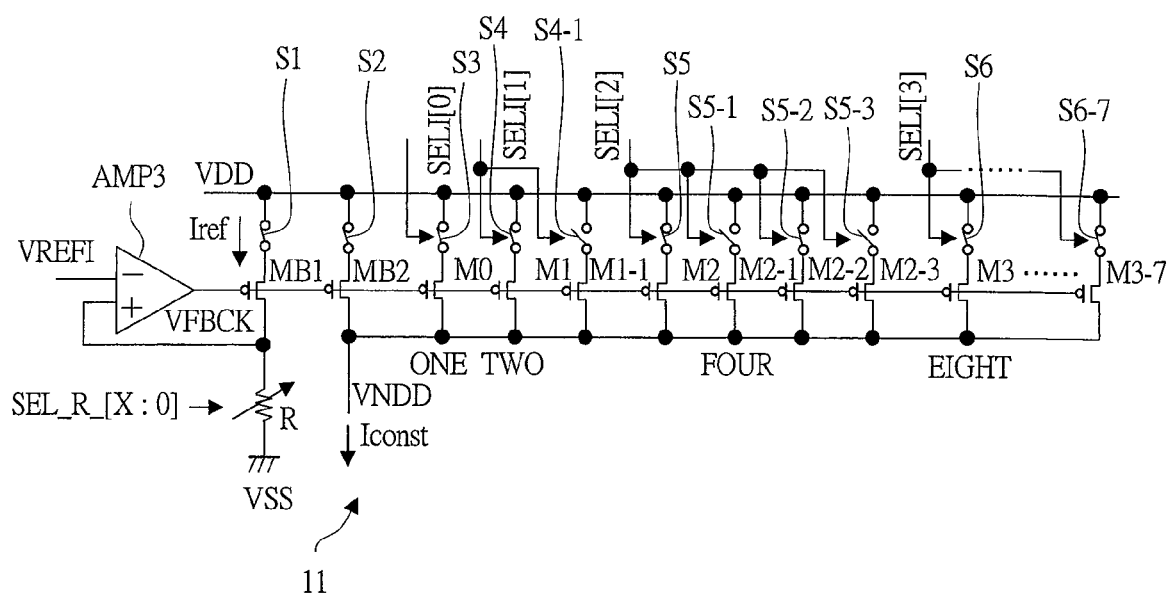
FIG. 9 is an explanatory drawing showing an example of a constant current generating circuit studied by the inventors of the present invention, which changes the current mirror ratio by the number of transistors to carry out frequency switching.
Figure 10:
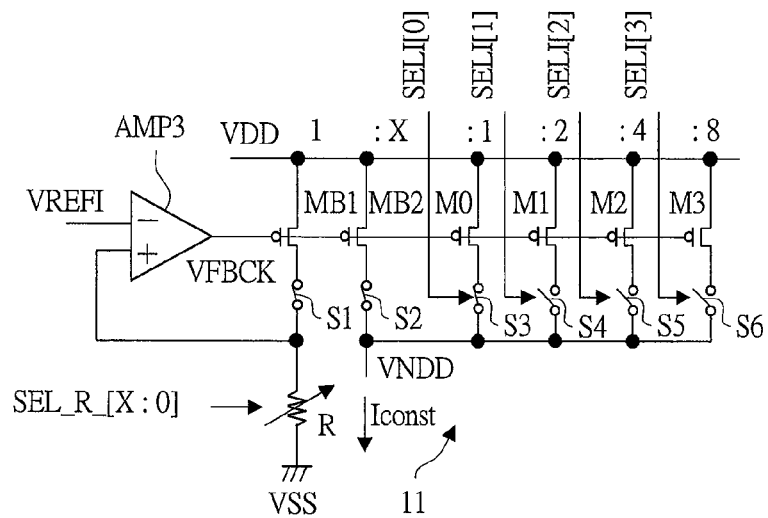
FIG. 10 is an explanatory drawing showing another example of the constant current generating circuit of FIG. 8.
Figure 11:
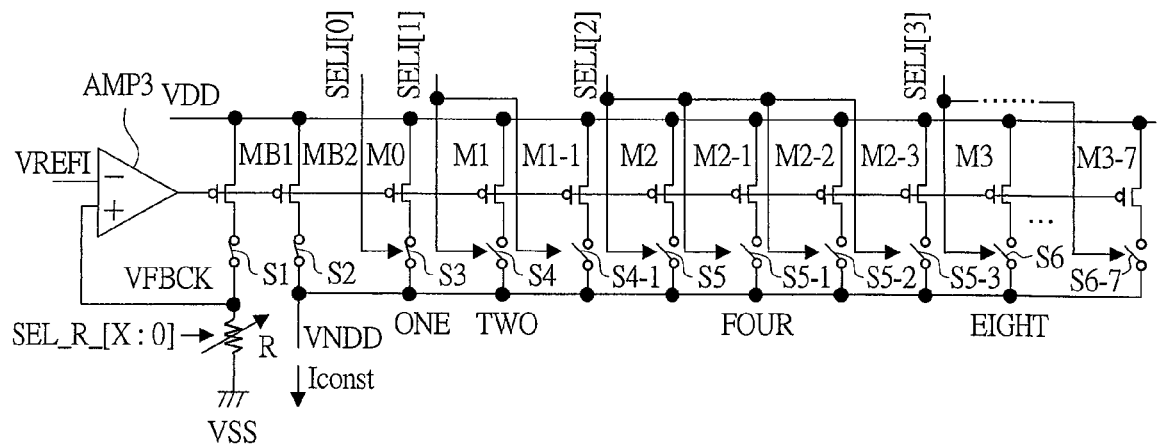
FIG. 11 is an explanatory drawing showing another example of the constant current generating circuit of FIG. 9.
Figure 12:
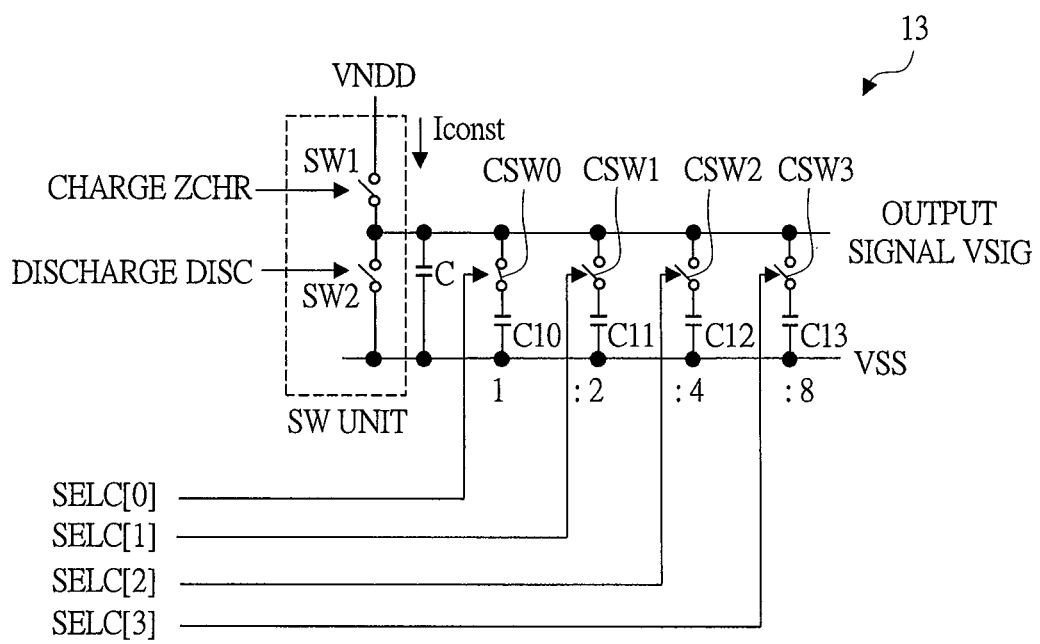
FIG. 12 is an explanatory drawing showing an example of a frequency-voltage converting circuit having a frequency switching function by electrostatic capacitive elements according to the first embodiment.
Figure 13:
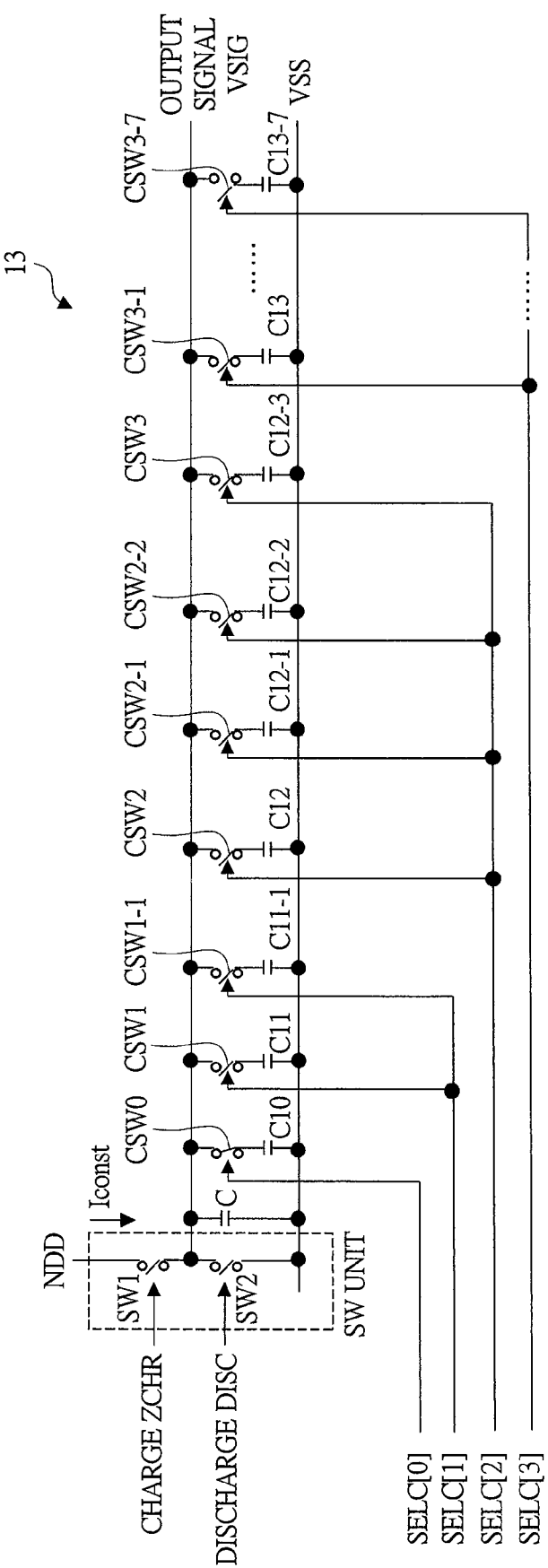
FIG. 13 is an explanatory drawing showing another example of the frequency-voltage converting circuit having the frequency switching function by electrostatic capacitive elements according to the first embodiment.
Figure 14:
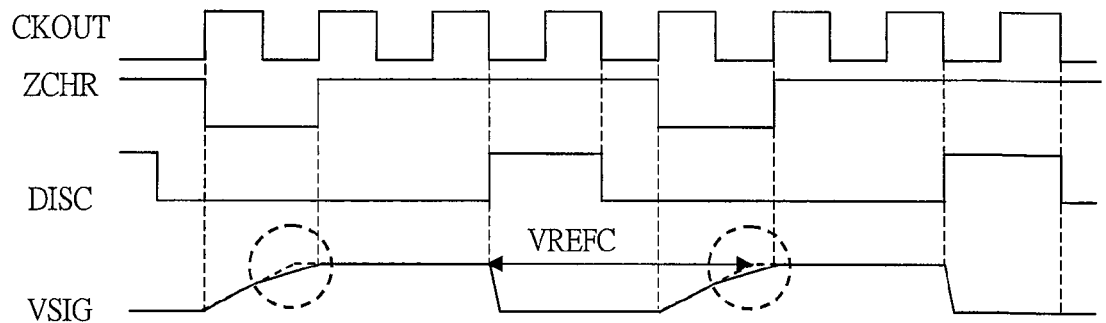
FIG. 14 is a timing chart showing an example of operation of the frequency-voltage converting circuit of FIG. 12.
Figure 15:
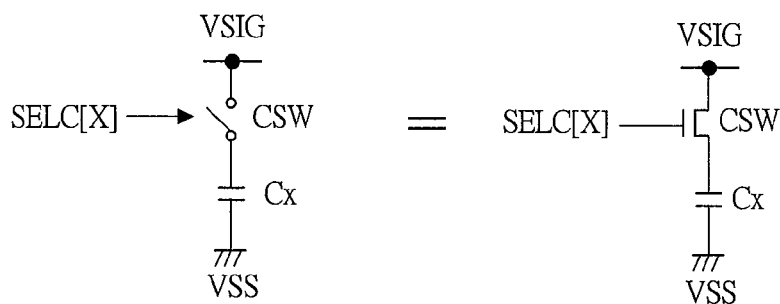
FIG. 15 is an explanatory drawing showing an example of a switch, which selects the electrostatic capacitive element provided in the drawing of the frequency-voltage converting circuit of FIG. 12.
Figure 16:
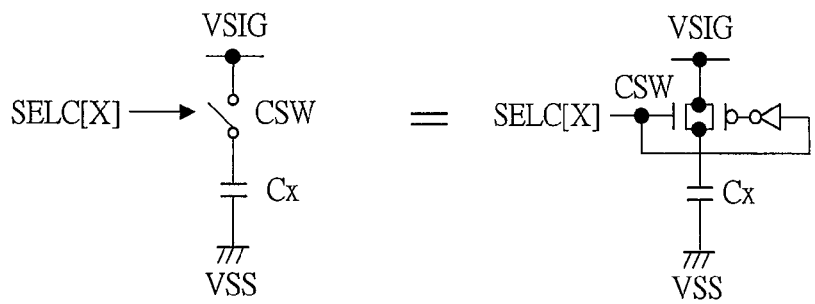
FIG. 16 is an explanatory drawing showing another example of the switch of FIG. 15.
Figure 17:
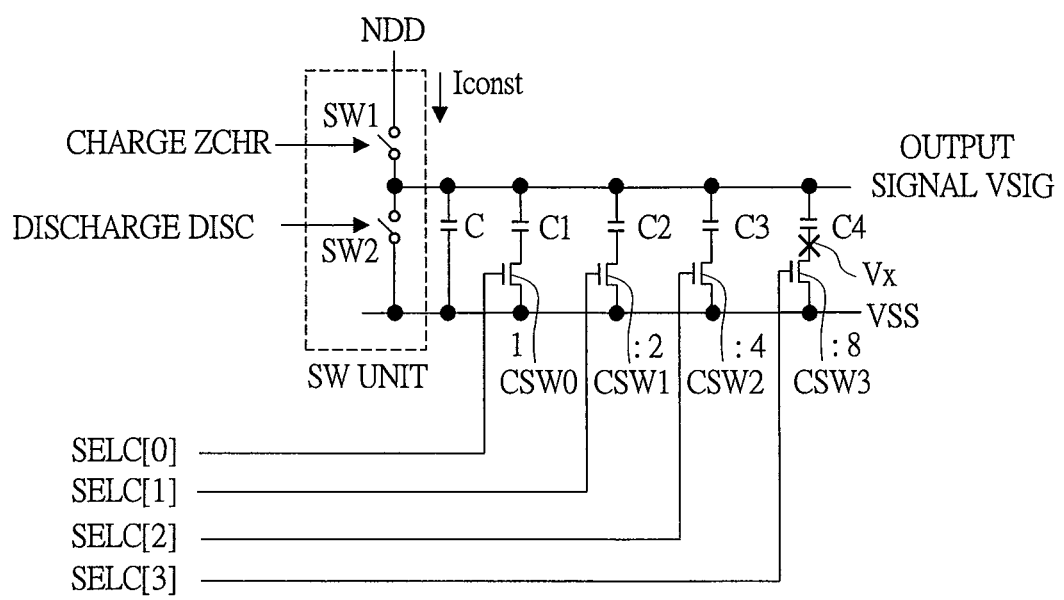
FIG. 17 is an explanatory drawing showing an example of the frequency-voltage converting circuit in which switches are provided on a negative-electrode side.
Figure 18:
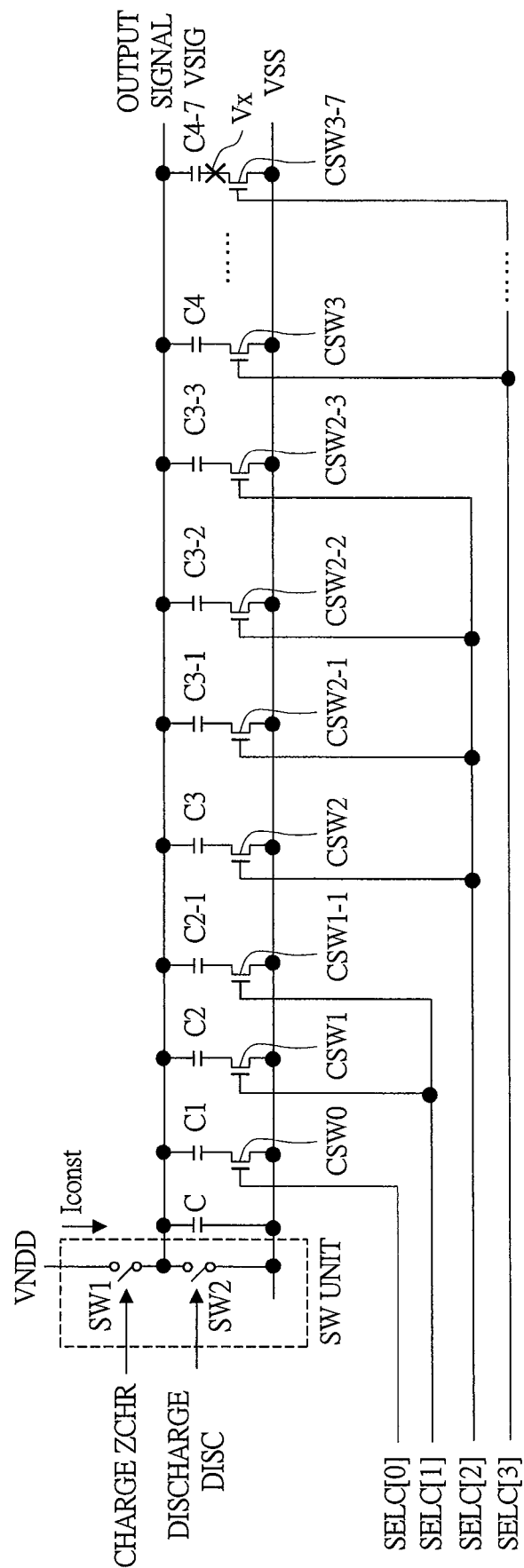
FIG. 18 is an explanatory drawing showing another example of the frequency-voltage converting circuit of FIG. 17.
Figure 19:
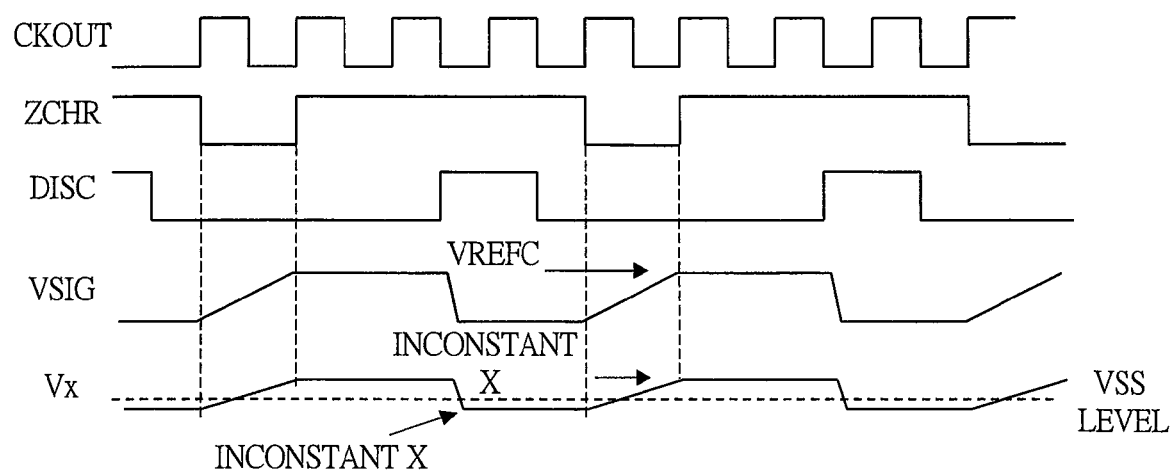
FIG. 19 is a timing chart showing an example of operation waveforms of a node Vx in the frequency-voltage converting circuit of FIG. 17.
Figure 20:
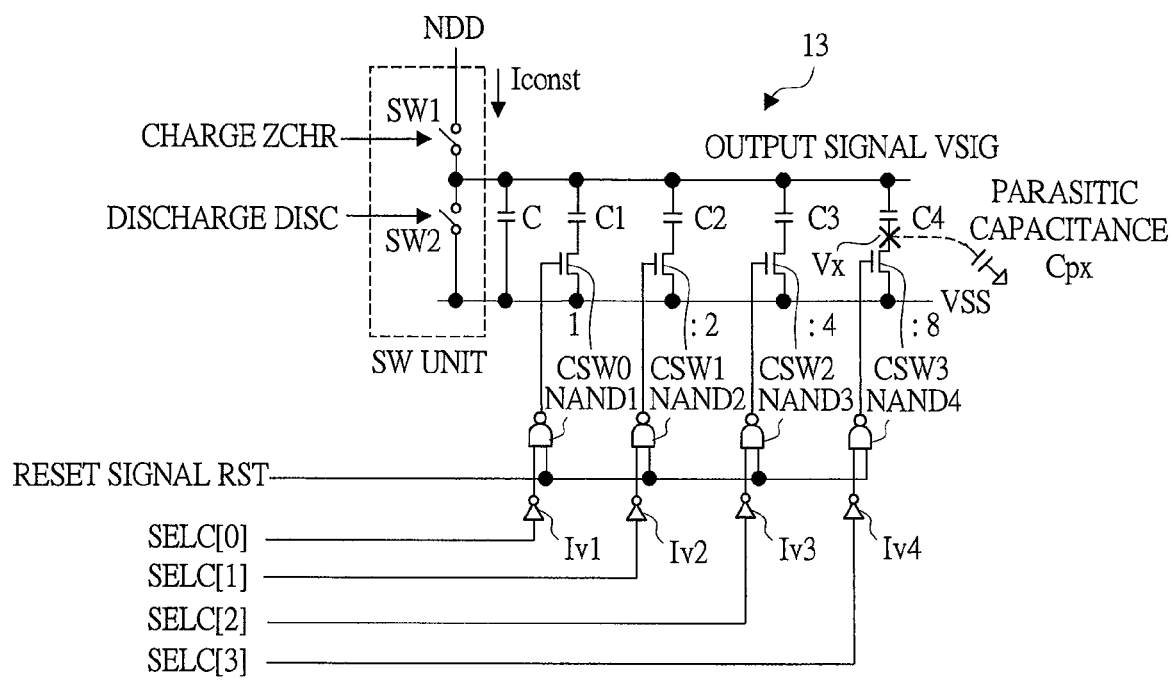
FIG. 20 is an explanatory drawing showing an example of the frequency-voltage converting circuit having a function of refreshing a node, which becomes inconstant, to a level of reference potential.
Figure 21:
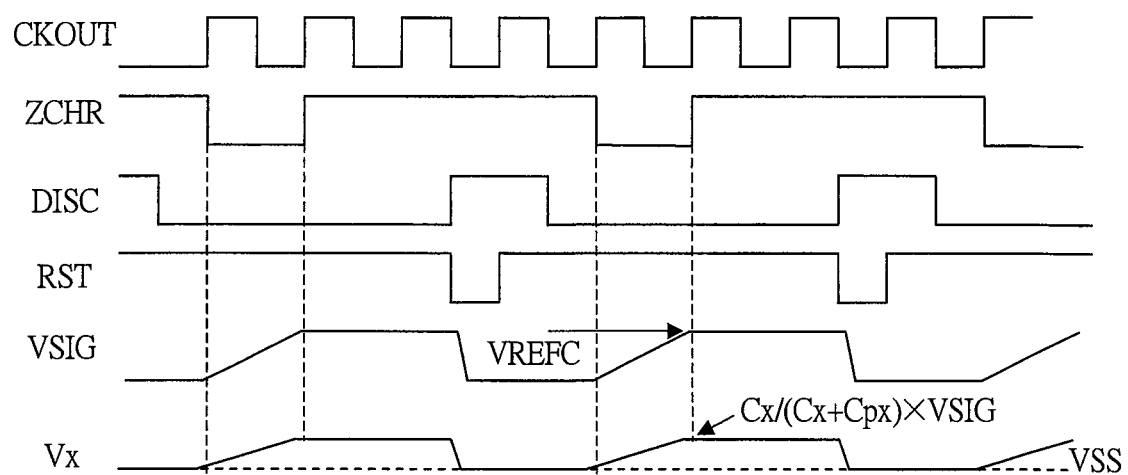
FIG. 21 is a timing chart showing an example of operation of the frequency-voltage converting circuit of FIG. 20.
Figure 22:
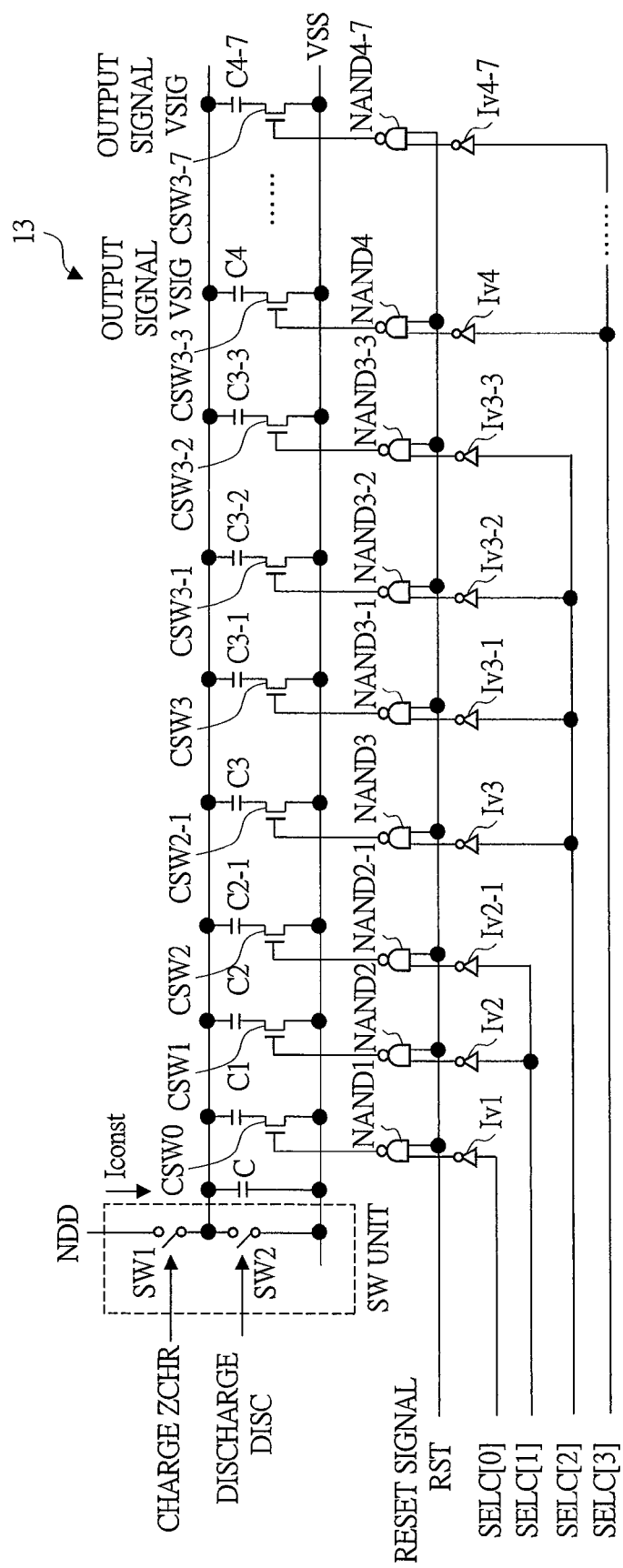
FIG. 22 is an explanatory drawing showing an example of a case in which the refreshing function is applied to the frequency-voltage converting circuit of FIG. 18.
Figure 23:
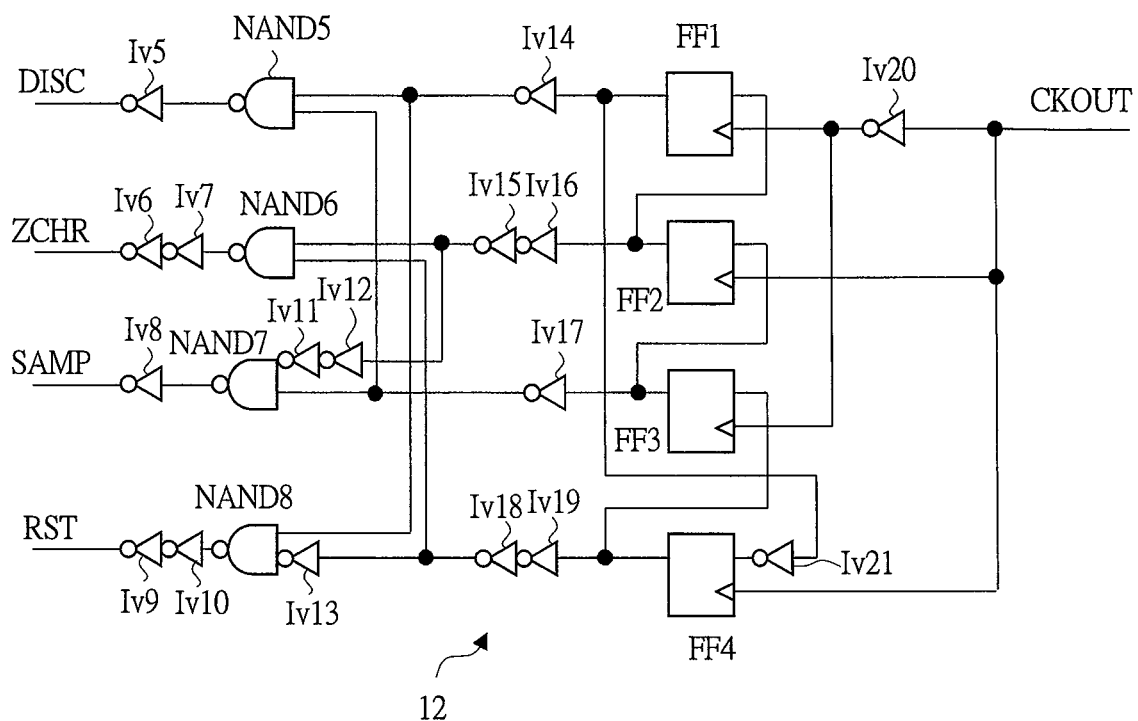
FIG. 23 is an explanatory drawing showing an example of a control circuit which controls the frequency-voltage converting circuit of FIG. 20.
Figure 24:
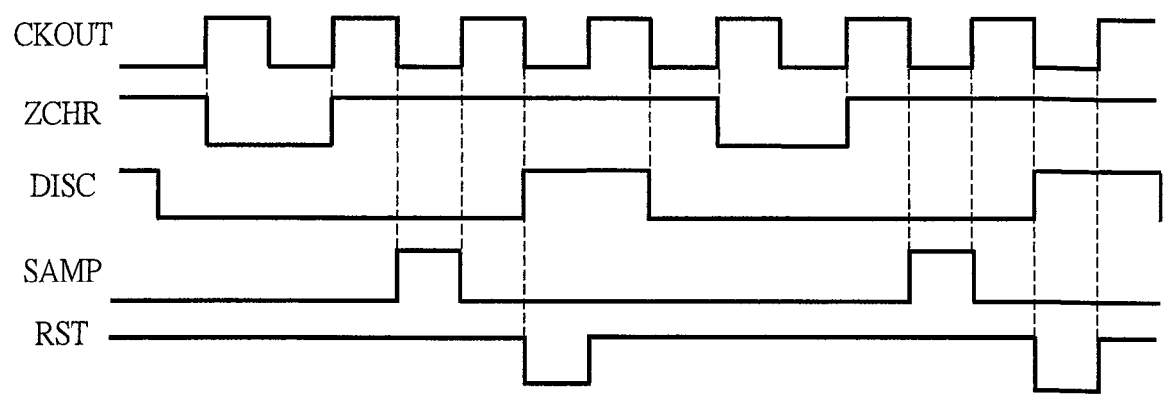
FIG. 24 is a timing chart of signals of each unit in the control circuit of FIG. 23.
Figure 25:
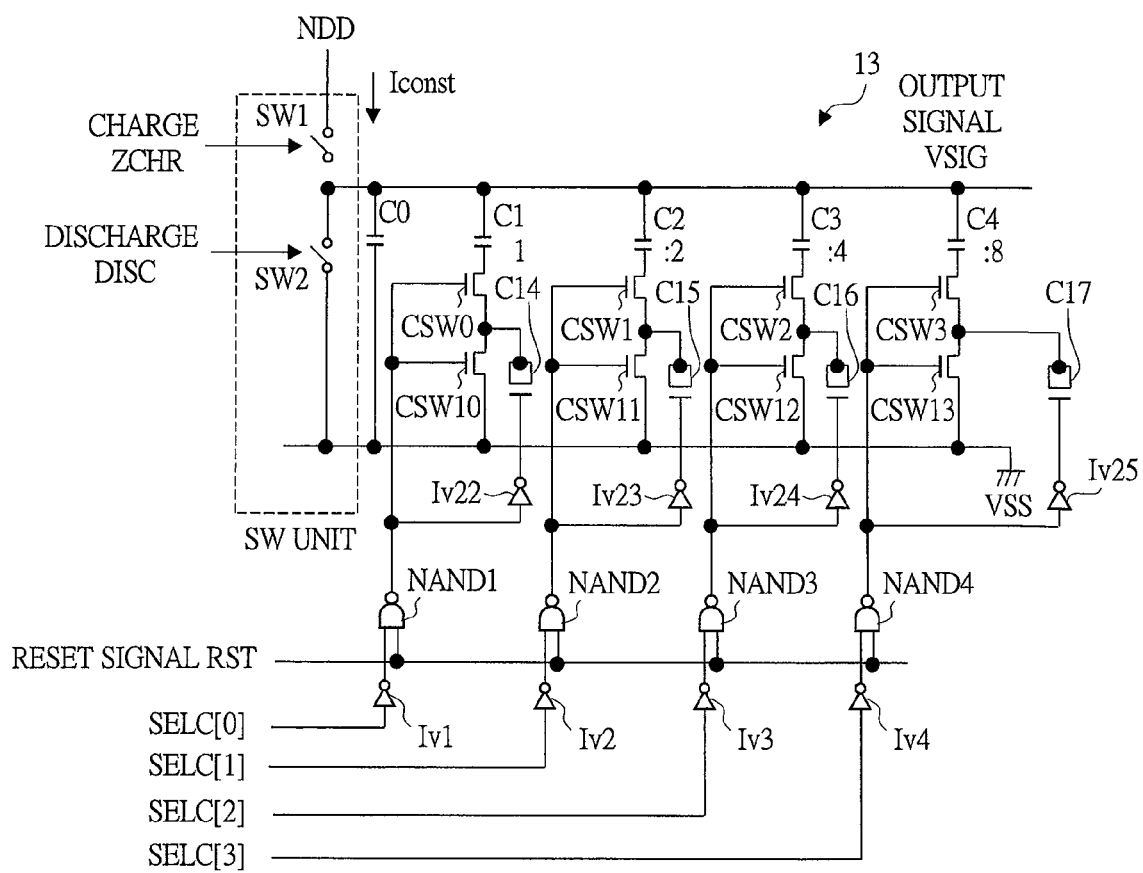
FIG. 25 is an explanatory drawing showing another circuit configuration of the frequency-voltage converting circuit of FIG. 20.
Figure 26:
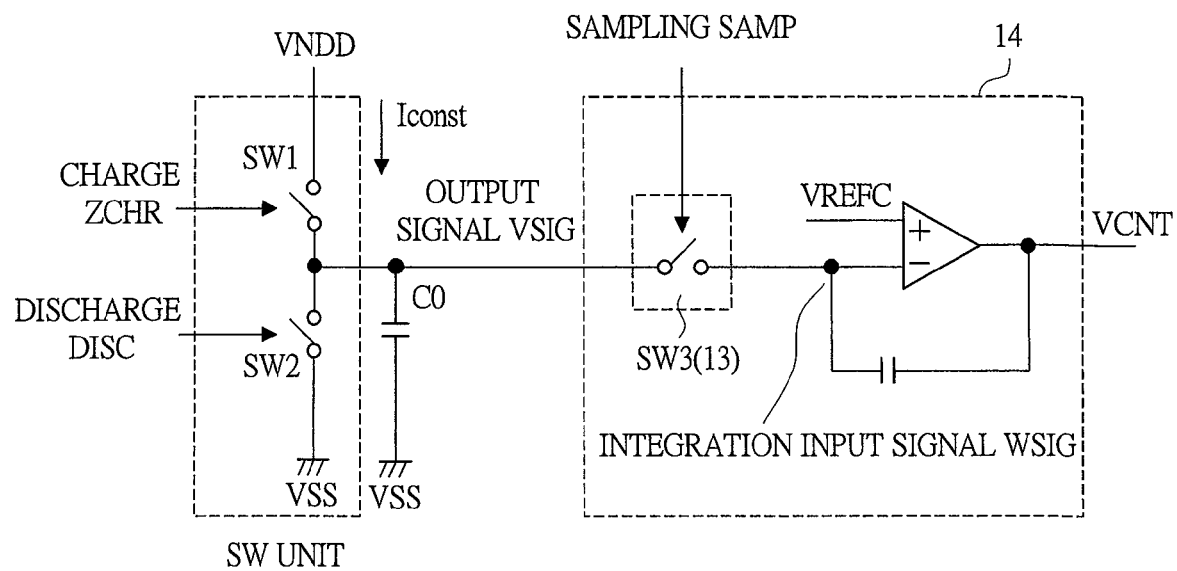
FIG. 26 is an explanatory drawing showing an example of connection of the frequency-voltage converting circuit and the integrating circuit.
Figure 27:
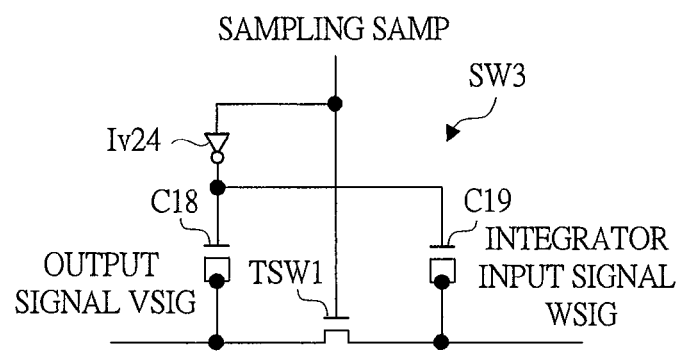
FIG. 27 is an explanatory drawing showing an example of a switch provided in the integrating circuit of FIG. 26.
Figure 28:
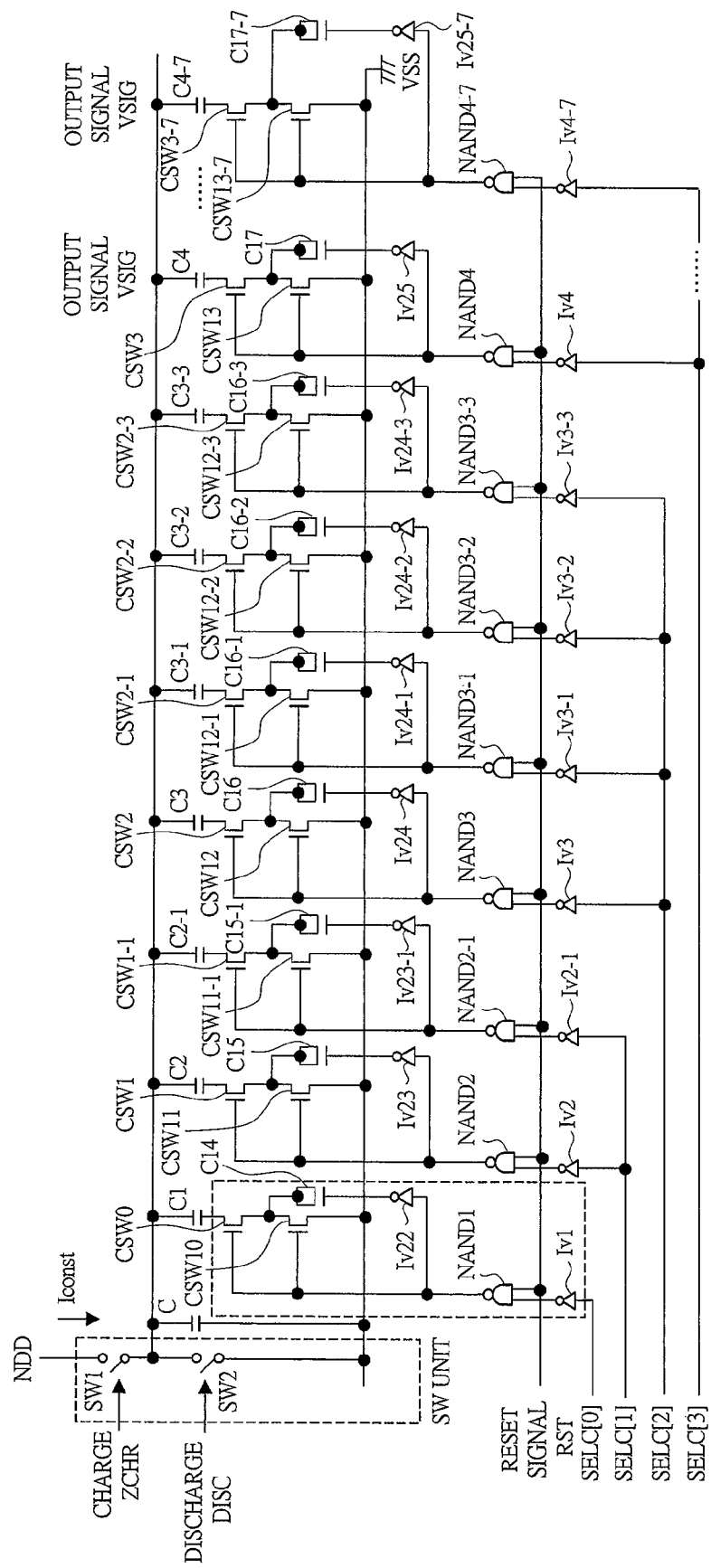
FIG. 28 is an explanatory drawing showing another circuit configuration of the frequency-voltage converting circuit of FIG. 22.
Figure 29:
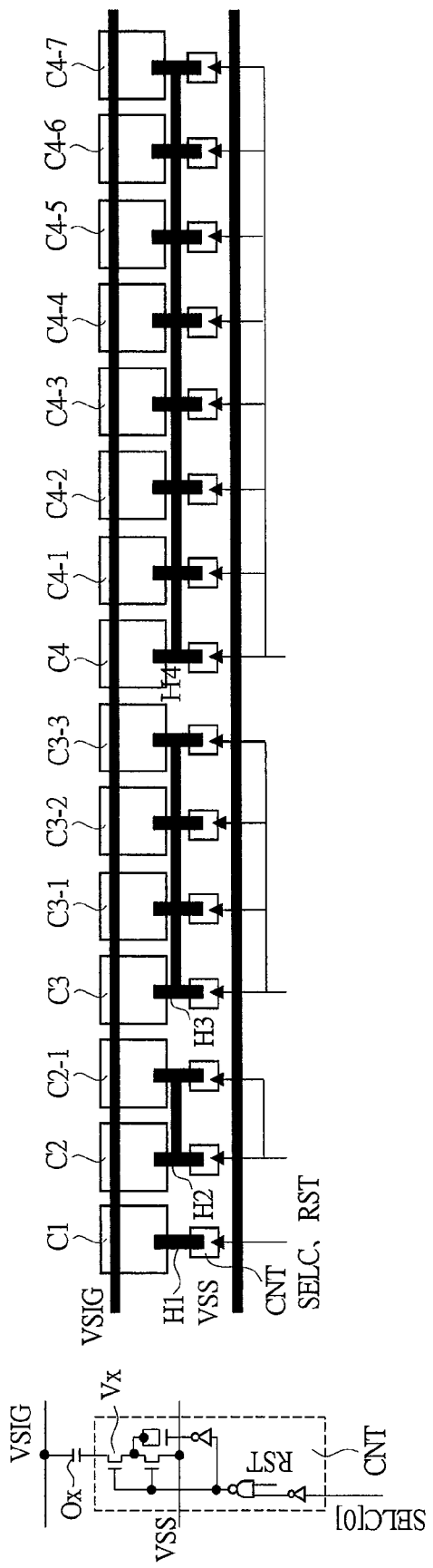
FIG. 29 is an explanatory drawing showing an example of the layout which minimizes a parasitic capacitance in the frequency-voltage converting circuit of FIG. 28.

FIG. 1 is a block diagram showing a configuration example of a semiconductor integrated circuit device according to a first embodiment of the present invention; FIG. 2 is a block diagram showing an example of the configuration of an oscillator unit provided in the semiconductor integrated circuit device of FIG. 1; FIG. 3 is an explanatory drawing showing an example of the temperature dependency of the voltages generated by a reference voltage generating circuit provided in the oscillator unit of FIG. 2; FIG. 4 is a timing chart showing an example of a process in which the oscillator unit of FIG. 2 adjusts a clock signal which is faster than an objective frequency; FIG. 5 is a timing chart showing an example of a process in which the oscillator unit of FIG. 2 adjusts a clock signal which is slower than an objective frequency; FIG. 6 is a timing chart showing an operation example of a case in which the oscillating frequency of the clock signal at the oscillator unit of FIG. 2 and an objective frequency match each other; FIG. 7 is an explanatory drawing showing an example of VF characteristics of a voltage control oscillator circuit provided in the oscillator unit of FIG. 2; FIG. 8 is an explanatory drawing showing an example of a constant current generating circuit studied by the inventors of the present invention, which changes a current mirror ratio by a transistor size to carry out frequency switching; FIG. 9 is an explanatory drawing showing an example of a constant current generating circuit studied by the inventors of the present invention, which changes the current mirror ratio by the number of transistors to carry out frequency switching; FIG. 10 is an explanatory drawing showing another example of the constant current generating circuit of FIG. 8; FIG. 11 is an explanatory drawing showing another example of the constant current generating circuit of FIG. 9; FIG. 12 is an explanatory drawing showing an example of a frequency-voltage converting circuit having a frequency switching function by electrostatic capacitive elements according to the first embodiment; FIG. 13 is an explanatory drawing showing another example of the frequency-voltage converting circuit having the frequency switching function by electrostatic capacitive elements according to the first embodiment; FIG. 14 is a timing chart showing an example of operation of the frequency-voltage converting circuit of FIG. 12; FIG. 15 is an explanatory drawing showing an example of a switch, which selects the electrostatic capacitive element provided in the drawing of the frequency-voltage converting circuit of FIG. 12; FIG. 16 is an explanatory drawing showing another example of the switch of FIG. 15; FIG. 17 is an explanatory drawing showing an example of the frequency-voltage converting circuit in which switches are provided on a negative-electrode side; FIG. 18 is an explanatory drawing showing another example of the frequency-voltage converting circuit of FIG. 17; FIG. 19 is a timing chart showing an example of operation waveforms of a node in the frequency-voltage converting circuit of FIG. 17; FIG. 20 is an explanatory drawing showing an example of the frequency-voltage converting circuit having a function of refreshing a node Vx, which becomes inconstant, to a level of reference potential; FIG. 21 is a timing chart showing an example of operation of the frequency-voltage converting circuit of FIG. 20; FIG. 22 is an explanatory drawing showing an example of a case in which the refreshing function is applied to the frequency-voltage converting circuit of FIG. 18; FIG. 23 is an explanatory drawing showing an example of a control circuit which controls the frequency-voltage converting circuit of FIG. 20; FIG. 24 is a timing chart of signals of each unit in the control circuit of FIG. 23; FIG. 25 is an explanatory drawing showing another circuit configuration of the frequency-voltage converting circuit of FIG. 20; FIG. 26 is an explanatory drawing showing an example of connection of the frequency-voltage converting circuit and the integrating circuit; FIG. 27 is an explanatory drawing showing an example of a switch provided in the integrating circuit of FIG. 26; FIG. 28 is an explanatory drawing showing another circuit configuration of the frequency-voltage converting circuit of FIG. 22; and FIG. 29 is an explanatory drawing showing an example of the layout which minimizes a parasitic capacitance in the frequency-voltage converting circuit of FIG. 28.

In the first embodiment, as shown in FIG. 1, the semiconductor integrated circuit device 1 is composed of an oscillator unit 2, a register 3, a memory 4, a frequency dividing circuit 5, a CPU 6, an A/D converter 7, a timer 8, a peripheral circuit 9, and others.

The oscillator unit 2 serving as clock oscillating means generates a clock signal supplied to internal modules of the semiconductor integrated circuit device 1. The frequency dividing circuit 5 arbitrarily subjects the clock signal generated by the oscillator unit 2 to frequency dividing and supplies the signal as an operation clock to internal modules such as the frequency dividing circuit 5, the CPU 6, the A/D converter 7, the timer 8, the peripheral circuit 9 serving as other modules, and others.

The CPU 6 controls operations in the semiconductor integrated circuit device 1. The A/D converter 7 converts an analog signal to a digital signal. The timer 8 counts up a timer clock or the like to set desired time and outputs a timer counter signal when it gets to a certain time.

The memory 4 is composed of a non-volatile memory exemplified by a flash memory and stores control signals, which have undergone trimming of the oscillator unit 2. When the semiconductor integrated circuit device 1 is activated, the control signals stored in the memory unit are read and stored in the register 3.

The oscillator unit 2 is operated and controlled based on the control signals stored in the register. The control signals stored in the memory 4 include temperature trimming signals CNTL_VREFI and CNTL_VREFC, frequency adjustment control signals SELI and SELC serving as adjusting signals for obtaining target frequencies, and others.

FIG. 2 is a block diagram showing an example of the configuration of the oscillator unit 2.

As shown in the drawing, the oscillator unit 2 is composed of a reference voltage generating circuit 10, a constant current generating circuit 11, a control circuit 12, a frequency-voltage converting circuit 13, an integrating circuit 14, and a voltage control oscillator circuit 15 and is a clock generating circuit forming a feedback loop by these circuits.

The reference voltage generating circuit 10 is composed of a bandgap reference circuit BGR, resistors R1 to R4, and a transistor Q1 composed of a bipolar element. The constant current generating circuit 11 is composed of an operational amplifier AMP1 and transistors T1 and T2 composed of P-channel MOS transistors.

The frequency-voltage converting circuit 13 is composed of switches SW1 to SW3 and an electrostatic capacitive element C1, and the integrating circuit 14 is composed of an operational amplifier AMP2 and an electrostatic capacitive element C2.

The reference voltage generating circuit 10 generates a reference voltage VREFI which has a temperature characteristic as shown on the upper left side of FIG. 3 and a reference voltage VREFC which has no power-supply and temperature dependency as shown on the right side of FIG. 3, respectively.

In the reference voltage generating circuit 10, the bandgap reference circuit BGR generates a current Iptat having positive primary temperature dependency. One connecting part of the resistor R1 is connected to an output part of the bandgap reference circuit BGR. The voltage generated at the resistor R1 is the reference voltage VREFI and is output to the constant current generating circuit 11.

A collector and a base of the transistor Q1 and one connecting part of the resistor R3 are connected to the other connecting part of the resistor R1. One connecting part of the resistor R2 is connected to an emitter of the transistor Q1, and a reference potential VSS is connected to the other connecting part of the resistor R2.

One connecting part of the resistor R4 is connected to the other connecting part of the resistor R3, and the reference potential VSS is connected to the other connecting part of the resistor R4. The voltage generated at the connecting part of the resistor R3 and the resistor R4 is output to the integrating circuit 14 as the reference voltage VREFC.

Furthermore, the constant current generating circuit 11 generates a current Iref having no power-supply and temperature dependency as shown on the lower left side of FIG. 3. The constant current Iref is generated by applying the reference voltage VREFI to a resistor Rosc, which has temperature dependency as shown at middle of the left side of FIG. 3, by a voltage follower circuit made up of the operational amplifier AMP1. At this time, a temperature characteristic is imparted to the reference voltage VREFI in the reference voltage generating circuit 10 so as to cancel out the temperature dependency of the resistor Rosc.

The reference voltage VREFI is connected to a negative (−) side input terminal of the operational amplifier AMP1 so as to be input thereto, and gates of transistors T1 and T2 are connected to an output part of the operational amplifier AMP1.

A power-supply voltage VDD is connected to one connecting parts of the transistors T1 and T2 so as to be supplied thereto, and a positive (+) side input terminal of the operational amplifier AMP1 and one connecting part of the resistor Rosc are connected to the other connecting part of the transistor T1.

The reference potential VSS is connected to the other connecting part of the resistor Rosc. Furthermore, the current Iconst is output from the other connecting part of the transistor T2, and the connecting part to which the other connecting part of the transistor T2 and the other connecting part of the switch SW1 of the frequency-voltage converting circuit 13 are connected is VNDD.

The frequency-voltage converting circuit 13 generates the voltage VSIG from the current Iconst (M·Iref) output from the constant current generating circuit 11, the capacitance of the electrostatic capacitive element C1, and the clock signal CKOUT output from the voltage control oscillator circuit 15 based on the control signal ZCHR generated in the control circuit 12. The control signal ZCHR is a signal having a pulse width equal to the cycle of the clock signal CKOUT.

In the frequency-voltage converting circuit 13, the power supply VNDD is connected to one connecting part of the switch SW1 so as to be supplied thereto, and one connecting part of the switch SW2, one connecting part of the switch SW3, and one connecting part of the electrostatic capacitive element C1 are connected to the other connecting part of the switch SW1. Furthermore, the reference potential VSS is connected to the other connecting part of the switch SW2 and the other connecting part of the electrostatic capacitive element C1.

ON/OFF (conduction/non-conduction) of the switch SW1 is controlled based on the control signal ZCHR output from the control circuit 12, ON/OFF (conduction/non-conduction) of the switch SW2 is controlled based on the control signal DISC output from the control circuit 12, and ON/OFF (conduction/non-conduction) of the switch SW3 is controlled based on the control signal SAMP also output from the control circuit 12.

The integrating circuit 14 is composed of, for example, a parallel-type switched capacitor integrating circuit, and it samples the voltage VSIG. The integrating circuit 14 generates the control voltage VCNT so that the reference voltage VREFC having no power-supply and temperature dependency and the voltage VSIG output from the frequency-voltage converting circuit 13 are equal to each other.

The voltage VSIG output from the other connecting part of the switch SW3 is connected to a negative (−) side input terminal of the operational amplifier AMP2 and one connecting part of the electrostatic capacitive element C2 so as to be input thereto.

The reference voltage VREFC is connected to a positive (+) side input terminal of the operational amplifier AMP2 so as to be input thereto, and the other connecting part of the electrostatic capacitive element C2 is connected to an output part of the operational amplifier AMP2 from which the control voltage VCNT is output to the voltage control oscillator circuit 15.

The voltage control oscillator circuit 15 adjusts the clock signal CKOUT based on the input control voltage VCNT so that the clock signal has a desired frequency and then outputs the signal. Also, the clock signal CKOUT generated by the voltage control oscillator circuit 15 is connected so as to be input also to the control circuit 12.

Here, an oscillation cycle Tckout of the clock signal CKOUT generated by the oscillator unit 2 is determined by the time taken to charge the voltage between both ends of the capacitor of the electrostatic capacitive element C1 of the frequency-voltage converting circuit 13 from 0 V to the voltage VREFC with the reference current Iconst (M·Iref) generated by the constant current generating circuit 11, and can be expressed by the following expression.

[Expression 3]

$$Tckout = (C \cdot VREFC)/(VREFI/R) = (C1 \cdot Rosc \cdot VREFC)/VREFI \quad \text{Expression (3)}$$

In order to output the clock signal CKOUT having no temperature and power-supply dependency from the oscillator unit 2, a mechanism that cancels out the temperature dependency of the electrostatic capacitive element C1 and the resistor Rosc is required.

Therefore, it is the reference voltage generating circuit 10 that generates the reference voltage that cancels out the temperature dependency of the electrostatic capacitive element C1 and the resistor Rosc. As shown in Expression (1), the reference voltage VREFI is a voltage having the temperature characteristic that cancels out the temperature dependency of the electrostatic capacitive element C1 and the resistor Rosc, and the reference voltage VREFC has to be the voltage that is not dependent on temperature.

Also, temperature trimming is carried out by observing the output frequency of the clock signal CKOUT, and it is generally carried out at a room temperature or high temperature. The voltage value of the reference voltage VREFI is switched so that the oscillation frequencies observed at the temperatures of two points match each other, and the control signals by which the frequencies match are written and stored in the memory 4 in advance.

Next, a process in which the oscillator unit 2 adjusts the clock signal CKOUT to a desired frequency will be described with reference to FIG. 4 to FIG. 6.

FIG. 4 is a timing chart showing an example of a case in which the oscillation frequency of the clock signal CKOUT is faster than an objective frequency, FIG. 5 is a timing chart showing an example of a case in which the oscillation frequency of the clock signal CKOUT is slower than the objective frequency, and FIG. 6 is a timing chart showing an example of a case in which the oscillation frequency of the clock signal CKOUT and the objective frequency match each other.

FIG. 4 to FIG. 6 show, from the top to the bottom, the signal timing of the clock signal CKOUT, the control signal ZCHR output from the control circuit 12, the control signal DISC output from the control circuit 12, the control signal SAMP output from the control circuit 12, the voltage VSIG generated by the frequency-voltage converting circuit 13 and the reference voltage VREFC generated by the reference voltage generating circuit 10, and the control voltage VCNT generated by the integrating circuit 14.

The oscillation cycle Tckout of the clock generated in the oscillator unit 2 is determined by the time taken to charge the voltage between both ends of the electrostatic capacitive element C1 of the frequency-voltage converting circuit 13 from 0 V to the reference voltage VREFC with the reference current Iconst (M·Iref) generated by the constant current generating circuit 11.

If the frequency of the clock signal CKOUT is faster than the objective frequency, as shown in FIG. 4, the voltage VSIG generated at the both ends of the electrostatic capacitive element C1 generated by charging the electrostatic capacitive element C1 with the reference current Iconst in the period of the oscillation cycle Tckout has a voltage value lower than that of the reference voltage VREFC.

The integrating circuit 14 playing the role of a comparator of the two voltages, that is, the voltage VSIG output from the frequency-voltage converting circuit 13 and the reference voltage VREFC causes charge sharing between the electrostatic capacitive element C1 and the electrostatic capacitive element C2 so that differential inputs (the reference voltage VREFC and the voltage VSIG) of virtual ground become equal to each other during a sampling period (SAMP=Hi).

If the frequency of the clock signal CKOUT is fast, electric charge moves from the electrostatic capacitive element C2 to the electrostatic capacitive element C1, and the control voltage VCNT input to the voltage control oscillator circuit 15 is increased (FIG. 7 shows an example of the VF characteristic of the voltage control oscillator circuit). Since the voltage control oscillator circuit 15 has a negative characteristic with respect to the control voltage VCNT, the oscillation frequency becomes slow.

On the contrary, if the oscillation frequency of the clock signal CKOUT is slower than the objective frequency, as shown in FIG. 5, the electrostatic capacitive element C1 is charged in the period of the oscillation cycle Tckout, and as a result, the voltage VSIG has a voltage value higher than that of the reference voltage VREFC.

As a result of charge sharing between the electrostatic capacitive element C1 and the electrostatic capacitive element C2, electric charge moves from the electrostatic capacitive element C1 to the electrostatic capacitive element C2, and the control voltage VCNT is reduced. As a result, the oscillation frequency of the clock signal CKOUT becomes fast.

Subsequently, if the oscillation frequency of the clock signal CKOUT and the objective frequency match each other, as shown in FIG. 6, the voltage VSIG and the reference voltage VREFC are equal to each other after charging. Therefore, electric charge does not move between the electrostatic capacitive element C1 and the electrostatic capacitive element C2, a frequency locked state is obtained, and stable operation can be achieved.

FIG. 8 is an explanatory drawing showing an example of the constant current generating circuit 11 studied by the inventors of the present invention.

Generally, an oscillator provided in a semiconductor integrated circuit device realizes frequency switching by a current mirror ratio of a constant current circuit.

In this case, as shown in the drawing, the constant current generating circuit 11 is composed of an operational amplifier AMP3, transistors MB1 and MB2, transistors M0 to M3, a resistor R, and switches S1 to S6. The transistors MB1, MB2, and M0 to M3 are composed of P-channel MOS transistors.

The reference voltage VREFI is input to a negative (−) side input terminal of the operational amplifier AMP3, and an output part of the operational amplifier AMP3 is connected to gates of the transistors MB1, MB2, and M0 to M3.

The switches S1 to S6 are composed of, for example, P-channel MOS transistors or the like. The power-supply-voltage VDD is connected to one connecting parts of the switches S1 to S6, and one connecting parts of the transistors MB1, MB2, and M0 to M3 are connected to the other connecting parts of the switches S1 to S6, respectively.

One connecting part of the resistor R and a positive (+) side input terminal of the operational amplifier AMP3 are connected to the other connecting part of the transistor MB1. The reference potential VSS is connected to the other connecting part of the resistor R.

The other connecting parts of the transistors MB2 and M0 to M3 are commonly connected, and frequency adjustment control signals SELI0 to SELI3 are connected to control terminals of the switches S3 to S6 so as to be input thereto, respectively.

Also, FIG. 9 shows a modification example of FIG. 8, and the constant current generating circuit 11 has a configuration in which transistors M1-1, M2-1 to M2-3, and M3-1 to M3-7 and switches S4-1, S5-1 to S5-3, and S61 to S6-7 are added to the configuration of FIG. 8 composed of the operational amplifier AMP3, the transistors MB1 and MB2, the transistors M0 to M3, the resistor R, and the switches S1 to S6. The transistors M1-1, M2-1 to M2-3, and M3-1 to M3-7 are composed of P-channel MOS transistors.

The frequency adjustment control signal SELI1 is connected to the control terminal of the switch S4-1 so as to be input thereto, and the frequency adjustment control signal SELI2 is connected to the switches S5-1 to S5-3 so as to be input thereto.

The frequency adjustment control signal SELI3 is connected to the switches S6-1 to S6-7 so as to be input thereto. The power-supply voltage VDD is connected to one connecting parts of the switches S4-1, S5-1 to S5-3, and S61 to S6-7.

One connecting parts of the transistors M1-1, M2-1 to M2-3, and M3-1 to M3-7 are connected to the other connecting parts of the switches S4-1, S5-1 to S5-3, and S61 to S6-7, and the other connecting parts of the transistors M1-1, M2-1 to M2-3, and M3-1 to M3-7 are configured to be commonly connected. The connection configuration other than that is similar to that of the constant current generating circuit 11 of FIG. 8.

In this case, the reference voltage VREFI generated by the reference voltage generating circuit 10 serves as an input voltage of the voltage follower circuit, a connecting part (node VFBCK) of the transistor MB1 and the resistor R serves as the voltage level of the reference voltage VREFI, and the constant current Iref=VREFI/R is generated.

Then, the generated current is switched to the current Iconst by the current mirror circuit composed of the transistors M0 to M3, thereby changing the frequency.

If the current Iconst is increased, the oscillation frequency becomes fast, and if the current Iconst is reduced reversely, the oscillation frequency becomes slow. The mirror ratio of the transistors M0 to M3 is switched by the size of the gate width W of the transistors as shown in FIG. 8 or is switched by the number of connected unit devices as shown in FIG. 9. At this time, controllability is good if the mirror ratio is weighted by 2, but it is not necessarily weighted by 2.

In the configuration of FIG. 8, the switches S1 to S6 are connected between the power-supply voltage VDD and one connecting parts of the transistors MB1, MB2, and M0 to M3. However, as shown in FIG. 10, the one connecting parts of the switches S2 to S6 may be connected to the other connecting parts of the transistors MB2 and M0 to M3, and the other connecting parts of the switches S2 to S6 may be commonly connected. The connection configuration other than that is similar to that of FIG. 8.

Also in the configuration of FIG. 9, the switches S1 to S6, S4-1, S5-1 to S5-3, and S61 to S6-7 are connected between the power-supply voltage VDD and the one connecting parts of the transistors MB1, MB2, M0 to M3, the transistors M1-1, M2-1 to M2-3, and M3-1 to M3-7. However, as shown in FIG. 11, the one connecting parts of the switches S2 to S6, S4-1, S5-1 to S5-3, and S61 to S6-7 may be connected to the other connecting parts of the transistors MB2, M0 to M3, the transistors M1-1, M2-1 to M2-3, and M3-1 to M3-7, and the other connecting parts of the switches S2 to S6, S4-1, S5-1 to S5-3, and S61 to S6-7 may be commonly connected. The connection configuration other than that is similar to that of FIG. 9.

Here, the frequency switching by mirror cannot avoid the influence of manufacturing variations of devices because the devices used for each frequency adjustment control signal SELI are different. Therefore, there is possibility that frequency accuracy may be changed depending on the frequency adjustment control signals SELI.

As the means for reducing it, for example, increasing the size of the transistors or applying an overdrive voltage Vgs-Vth up to a level at which the influence of the threshold voltage ΔVth does not affect the frequency accuracy is necessary.

However, there is a tradeoff relation with area reduction if the transistor size is increased and with voltage reduction (power consumption reduction) if the overdrive voltage is applied.

[Expression 4]

$$Id = \frac{\mu \cdot C_{ox}}{2} \cdot \frac{W}{L}(Vgs - Vth)^2 \quad \text{Expression (4)}$$

As a technique for solving this problem, for example, there is frequency switching by electrostatic capacitive elements provided in the frequency-voltage converting circuit 13.

The frequency switching by the electrostatic capacitive elements is free from variation in the threshold voltages of the transistors unlike the current mirror and has comparatively good pair accuracy between the elements. Therefore, designing is easy, and variation in the frequency accuracy among the frequency adjustment control signals SELI can be eliminated by selecting electrostatic capacitive elements such as poly-poly capacitors having small variation.

However, in order to realize switching of the electrostatic capacitive elements, a circuit has to be added to the VSIG node of the frequency-voltage converting circuit 13 which is extremely sensitive to frequency accuracy, and a circuit configuration which minimizes the parasitic capacitance Cp2 in Expression (2) is required.

FIG. 12 is an explanatory drawing showing an example of the frequency-voltage converting circuit 13 having the frequency switching function by electrostatic capacitive elements.

In this case, as shown in the drawing, the frequency-voltage converting circuit 13 is composed of a switch unit including switches SW1 and SW2, the electrostatic capacitive elements C and C10 to C13, and switches CSW0 to CSW3 constituting a capacitor selecting unit.

The power supply VNDD is connected to one connecting part of the switch SW1 so as to be supplied thereto, and one connecting part of the switch SW2, one connecting part of the electrostatic capacitive element C, and one connecting parts of the switches CSW0 to CSW3 are connected to the other connecting part of the switch SW1.

One connecting parts of the electrostatic capacitive elements C10 to C13 are connected to the other connecting parts of the switches CSW0 to CSW3, respectively. The reference potential VSS is connected to the other connecting part of the switch SW2 and the other connecting parts of the electrostatic capacitive elements C and C10 to C13, respectively.

The control signal ZCHR is connected to a control terminal of the switch SW1 so as to be input thereto, and the control signal DISC is connected to a control terminal of the switch SW2 so as to be input thereto. 4-bit frequency adjustment control signals SELC0 to SELC3 are connected to control terminals of the switches CSW0 to CSW3 so as to be input thereto, respectively.

The switch unit including the switches SW1 and SW2 charges/discharges the capacitors by using the current Iconst supplied from the constant current generating circuit 11. The control signal ZCHR output from the control circuit 12 is a charging signal, and the control signal DISC output from the control circuit 12 is a discharging signal.

FIG. 13 is an explanatory drawing showing another example of the frequency-voltage converting circuit 13 having a frequency switching function by electrostatic capacitive elements.

In this case, as shown in the drawing, the frequency-voltage converting circuit 13 has a configuration in which the electrostatic capacitive elements C11-1, C12-1 to C12-3, and C13-1 to C13-7 and switches CSW1-1, CSW2-1 to CSW2-3, and CSW3-1 to CSW3-7 are added to the configuration of FIG. 12 which is composed of the switch unit including the switches SW1 and SW2, the electrostatic capacitive elements C and C10 to C13, and the switches CSW0 to CSW3.

One connecting parts of the switches CSW1-1, CSW2-1 to CSW2-3, and CSW3-1 to CSW3-7 are connected to the connecting part of the switch SW1 and the switch SW2. One connecting parts of the electrostatic capacitive elements C11-1, C12-1 to C12-3, and C13-1 to C13-7 are connected to the other connecting parts of the switches CSW1-1, CSW2-1 to CSW2-3, and CSW3-1 to CSW3-7, respectively, and the reference potential VSS is connected to the other connecting parts of the electrostatic capacitive elements C11-1, C12-1 to C12-3, and C13-1 to C13-7.

A frequency adjustment control signal SELC1 is connected to a control terminal of the switch CSW1-1 so as to be input thereto, and a frequency adjustment control signal SELC2 is connected to control terminals of the switches CSW2-1 to CSW2-3 so as to be input thereto.

A frequency adjustment control signal SELC3 is connected to control terminals of the switches CSW3-1 to CSW3-7 so as to be input thereto. The connection configuration other than that is similar to that of FIG. 12. In this case, controllability is good if the capacitance ratio among the capacitors is weighted by 2, but the ratio is not necessarily weighted by 2, and may have the same capacitance value or be appropriately weighted.

FIG. 14 is a timing chart showing an example of the operation of the frequency-voltage converting circuit 13 of FIG. 12.

The control signal ZCHR is generated in the control circuit 12 by subjecting the clock signal CKOUT to frequency dividing, and the width L thereof is approximately equal to the cycle of the clock signal CKOUT. Also, the control signal DISC discharges the electric charge of the electrostatic capacitive elements C and C10 to C13 to adjust the voltage VSIG to be the level of the reference potential VSS at the timing that does not affect the charging period.

In FIG. 13, the case in which control is carried out once per four cycles of the clock signal CKOUT is taken as an example, but control can be carried out once per two cycles of the clock signal CKOUT. Alternatively, even in the case of four cycles or more, the operation of the frequency-voltage converting circuit 13 is not affected.

The oscillator unit 2 carries out negative feedback control in the frequency-voltage converting circuit 13 so that the output voltage VSIG is equal to the reference voltage VREFC as shown in Expression (5). In order to realize high frequency accuracy, it is important to eliminate power-supply and temperature dependency and formation of non-linear components in the charging operation.

[Expression 5]

$$Q = C \cdot VREFC$$
$$Iconst \cdot Tout = C \cdot VREFC$$
$$VREFC = \frac{Iconst \cdot Tout}{C} = VSIG$$

Expression (5)

In the circuit configurations shown in FIG. 12 and FIG. 13, the select switches CSW0 to CSW3 are provided on the positive electrode side (hereinafter, the electrode on the side where the voltage level after charging is high is referred to as a positive electrode) to control the electrostatic capacitive elements C10 to C13, respectively.

The electrostatic capacitive elements C10 to C13 are composed of the elements having mutually different absolute values of the capacitances (FIG. 12) or having mutually different numbers of connected unit capacitors (FIG. 13), and are provided so as to cover the frequency range intended by a designer. When variation is taken into consideration, weighting by the number of unit capacitors is preferred, and weighting by 2 is preferred when controllability is taken into consideration.

For example, the switch CSW which selects the electrostatic capacitive element is composed of an N-channel MOS transistor as shown in FIG. 15, or has a configuration in which an N-channel MOS transistor and a P-channel MOS transistor are connected in parallel as shown in FIG. 16.

Also, since a sufficient bias cannot be applied to a transistor serving as a switch because the setting level of the reference voltage VREFC has a limit and cannot be set to a high level, ON resistance is increased when a source voltage is changed along with a charging operation, and non-linearity due to ON resistance and capacitance is formed in Expression (5). Therefore, the advantage obtained by applying a P-channel MOS transistor as a switch is small.

Also in the case in which a switch is composed of an N-channel MOS transistor, as shown in FIG. 14, constant ON resistance cannot be obtained in the charging period because the source voltage is increased along with charging like in the case of the switch using a P-channel MOS transistor, and non-linear components are formed in the voltage increase of the capacitor.

Therefore, if the condition that the reference voltage VREFC is set at a low voltage level which is not affected by the ON resistance of the switch of an N-channel MOS transistor can be satisfied, frequency switching by capacitor can be realized by a switch of an N-channel MOS transistor.

Moreover, since a parasitic capacitance Cp2 of the switch using the N-channel MOS transistor is generated in the output voltage VSIG, the circuit configuration of FIG. 12 is desired to have a large capacitance so as not to be affected by the parasitic capacitance Cp2.

FIG. 17 is an explanatory drawing showing an example of the frequency-voltage converting circuit 13 in which the switches CSW0 to CSW3 composed of N-channel MOS transistors are provided on the negative electrode side (hereinafter, the electrode on the side where the voltage level after charging is low is referred to as a negative electrode).

Also, FIG. 18 is an explanatory drawing showing an example of the frequency-voltage converting circuit 13 in which the switches CSW0 to CSW3, CSW1-1, CSW2-1 to CSW2-3, and CSW3-1 to CSW3-7 composed of N-channel MOS transistors are provided on the negative electrode side.

FIG. 19 is a timing chart showing an example of operation waveforms of a node Vx in the frequency-voltage converting circuit 13 of FIG. 17.

When the switches CSW0 to CSW3 are provided on the negative electrode side of the electrostatic capacitive elements C and C10 to C13 as shown in FIG. 17, the ON resistance of a charging period can be made constant (voltage between a gate and a source becomes constant), and non-linearity in the charging operation can be improved.

However, since the switches CSW0 to CSW3 are provided on the negative electrode side of the electrostatic capacitive elements C and C10 to C13, as shown in FIG. 19, the node Vx shown in FIG. 17 becomes inconstant when not selected, and the Vx potential is increased by a leakage current via the switches CSW0 to CSW3 and affects the frequency accuracy.

The circuit configuration of FIG. 17 has been described herein. However, even in the circuit configuration of FIG. 18, the node Vx similarly becomes inconstant, and the Vx potential is increased by the leakage current via the switches CSW0 to CSW3-7 and affects the frequency accuracy.

FIG. 20 is an explanatory drawing showing an example of the frequency-voltage converting circuit 13 having a function of refreshing the node Vx, which becomes inconstant, to the level of the reference potential VSS.

In this case, as shown in the drawing, the frequency-voltage converting circuit 13 has a configuration in which a reset unit composed of NAND circuits NAND1 to NAND4 and inverters Iv1 to Iv4 is newly added to the circuit configuration of FIG. 17.

The frequency adjustment control signals SELC0 to SELC3 are connected to input parts of the inverters Iv1 to Iv4 so as to be input thereto. One input parts of the NAND circuits NAND1 to NAND4 are connected to output parts of the inverters Iv1 to Iv4, respectively, and a reset signal RST output from the control circuit 12 is connected to the other input parts of the NAND circuits NAND1 to NAND4 so as to be input thereto.

Also, control terminals of the switches CSW0 to CSW3 are connected to the output parts of the NAND circuits NAND1 to NAND4, respectively. The connection configuration other than that is similar to that of FIG. 17.

In the circuit of FIG. 20, the node Vx which becomes inconstant between a non-selected electrostatic capacitive element and a switch is subjected to refreshing to the level of the reference potential VSS in one control cycle, so that the level of the node Vx is determined by voltage dividing of a selected capacitor and a parasitic capacitance of the inconstant node as shown in the following Expression (6).

[Expression 6]

$$Vx = \frac{Cx}{(Cx + Cpx)} \cdot VSIG \qquad \text{Expression (6)}$$

In order to introduce the refreshing function, the frequency-voltage converting circuit 13 is configured so that a reset signal RST is newly input thereto.

FIG. 21 is a timing chart showing an example of the operation of the frequency-voltage converting circuit 13 of FIG. 20.

As shown in the drawing, when the reset signal RST is input, the switches (CSW0 to CSW3) of the node Vx, which has become inconstant, are turned on, and the node Vx is refreshed to the voltage level of the reference potential VSS. The refreshing should be carried out at the timing that does not affect frequency accuracy, and the timing to carry out the refreshing is optimum in the discharging period of the capacitor.

As shown in FIG. 22, the refreshing function shown in FIG. 20 can be applied also to the frequency-voltage converting circuit 13 shown in FIG. 18. In this case, the frequency-voltage converting circuit 13 has a configuration in which NAND circuits NAND1 to NAND4, NAND2-1, NAND3-1 to 3-3, and NAND4-1 to 4-7 and inverters Iv1 to Iv4, Iv2-1, Iv3-1 to Iv3-3, and Iv4-1 to Iv4-7 are newly added to the circuit configuration of FIG. 18.

FIG. 23 is an explanatory drawing showing an example of the control circuit 12, which controls the frequency-voltage converting circuit 13 of FIG. 20. FIG. 24 is a timing chart of signals of each unit in the control circuit of FIG. 23.

As shown in FIG. 23, the control circuit 12 is composed of inverters Iv5 to Iv21, NAND circuits NAND5 to NAND8, and flip-flops FF1 to FF4. As shown in FIG. 23, the control circuit 12 imparts the information of an output cycle to the control signal ZCHR, which is a charge signal determining the frequency accuracy of the clock signal CKOUT, with good accuracy by using only a rising edge of the clock signal CKOUT, thereby realizing the frequency-voltage converting operation. The reset signal RST is generated by using the control signal DISC which is a discharge signal.

FIG. 25 is an explanatory drawing showing another circuit configuration of the frequency-voltage converting circuit 13 of FIG. 20. FIG. 26 is an explanatory drawing showing an example of the connection of the frequency-voltage converting circuit 13 and the integrating circuit 14.

In this case, the frequency-voltage converting circuit 13 has a configuration in which switches CSW10 to CSW13, electrostatic capacitive elements C14 to C17, and inverters Iv22 to IV25 are newly added to the circuit shown in FIG. 20.

As shown in FIG. 26, the integrating circuit 14 is connected via the switch SW3 serving as a sampling switch controlled by the control signal SAMP and constitutes a parallel-type switched capacitor integrating circuit.

As shown in FIG. 27, the switch SW3 is composed of an inverter Iv24, electrostatic capacitive elements C18 and C19, and an N-channel MOS transistor TSW1.

Therefore, after charging is completed, the voltage VSIG output from the frequency-voltage converting circuit 13 has to be held until the node is connected to the integrating circuit 14.

In the circuit configuration shown in FIG. 20 described above, since the voltage expressed by Expression (6) is applied between the drain and source of the transistor (CSW0 to CSW3) not selected during the holding period, a sub-threshold leakage, though minute, is generated, and slight temperature dependency is caused in the output frequency.

However, in the circuit configuration of FIG. 25, the transistors serving as select switches have a two-stage configuration in which N-channel MOS transistors are connected in series so as to suppress the leakage current.

FIG. 28 is an explanatory drawing showing another circuit configuration of the frequency-voltage converting circuit 13 of FIG. 22.

The frequency-voltage converting circuit 13 of FIG. 28 has a configuration in which inverters Iv23-1, Iv24-1 to Iv24-3, Iv25-1 to Iv25-7, switches CSW10, CSW11, CSW11-1, CSW12, CSW12-1 to CSW12-3, CSW13, CSW13-1 to CSW13-7, electrostatic capacitive elements C14, C15, C15-1, C16, C16-1 to C16-3, C17, and C17-1 to C17-7 are newly added to the circuit configuration of FIG. 22.

Also in this case, transistors serving as select switches have two-stage configuration in which N-channel MOS transistors are connected in series so as to suppress the leakage current like in FIG. 25.

As shown in Expression (2), the parasitic capacitance Cpx in the voltage VSIG output from the frequency-voltage converting circuit 13 affects frequency accuracy.

For example, as shown in FIG. 19, the parasitic capacitance Cpx between the non-selected electrostatic capacitive element (C10 to C13) and the switch CSW is found in the voltage VSIG as a capacitance parallel with a switch capacitance Cx.

$$Cp2 = Cpx // Cx \qquad \text{[Expression 7]}$$

Therefore, the parasitic capacitance Cpx has to be minimized. FIG. 29 is an explanatory drawing showing an example of a layout that minimizes the parasitic capacitance Cpx in the frequency-voltage converting circuit 13 of FIG. 28.

As shown in the drawing, wires H1 to H4 between the electrostatic capacitive elements C1 to C4, C2-1, C3-1 to C3-3, and C4-1 to C4-7 serving as control unit capacitors and the control unit (circuit configuration surrounded by a dotted line in FIG. 28) CNT are connected by the shortest distances to suppress parasitic capacitance. Since the reset signal is varied for each function, the control unit CNT is disposed above or below the electrostatic capacitive element so as to avoid crosstalk with the electrostatic capacitive element.

Second Embodiment

Figure 30:
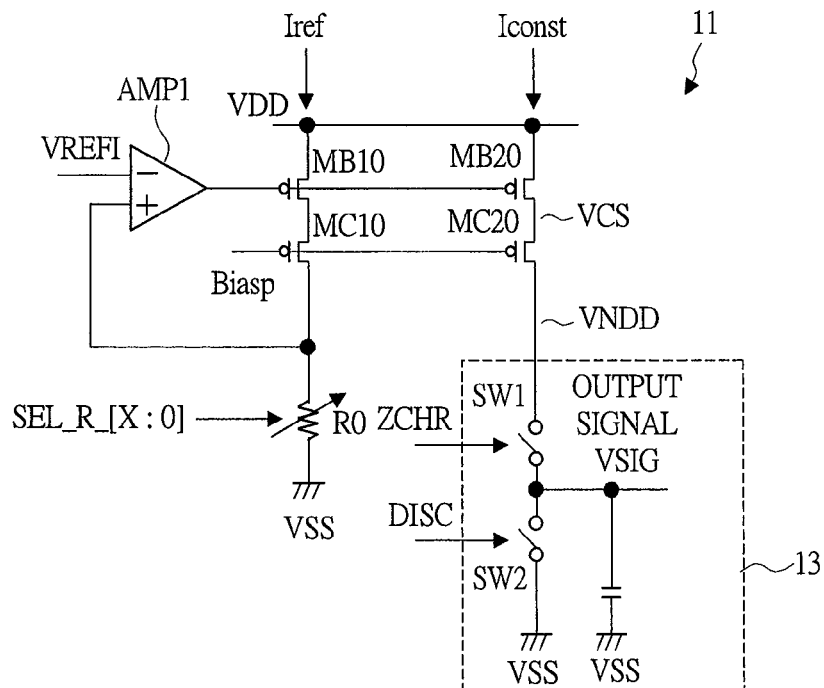
FIG. 30 is an explanatory drawing showing a detailed circuit configuration of the constant current generating circuit according to a second embodiment.
Figure 31:
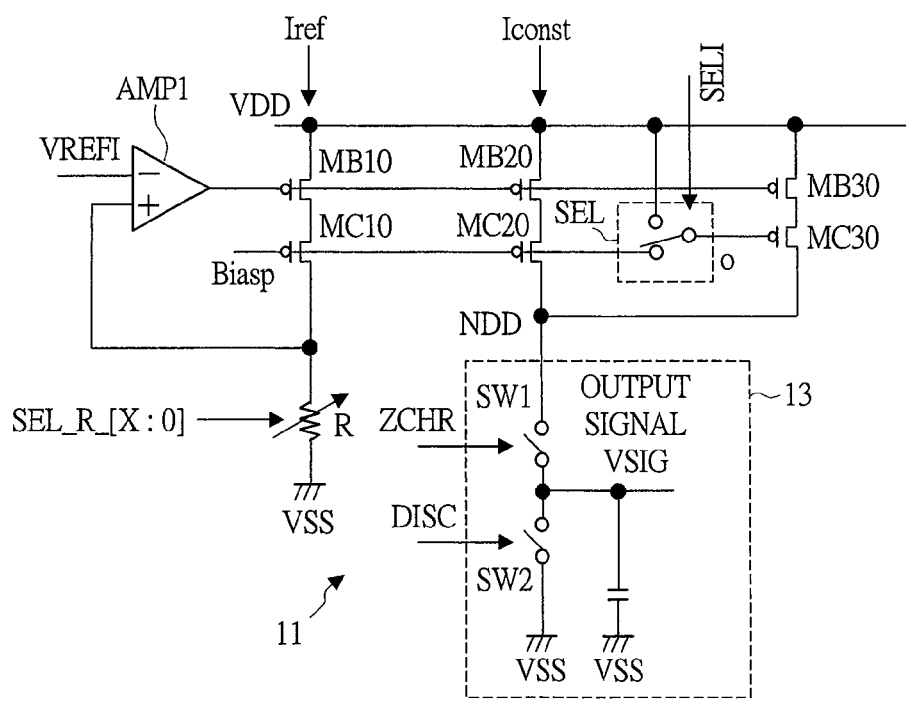
FIG. 31 is an explanatory drawing showing an example of a case in which the constant current generating circuit of FIG. 30 has a current switching function.
Figure 32:
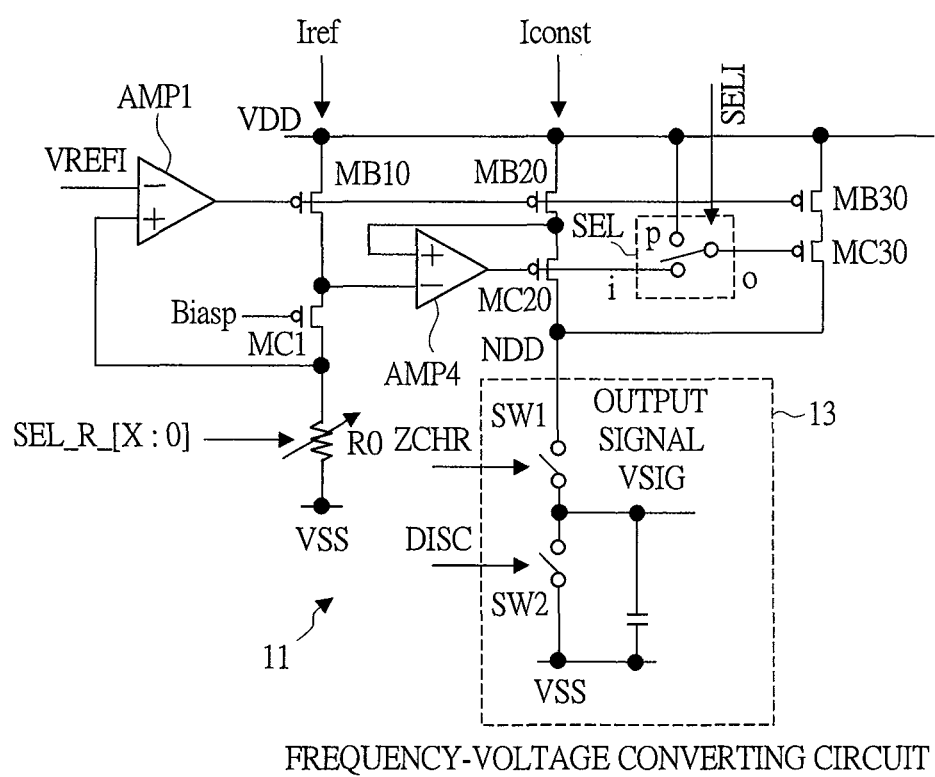
FIG. 32 is an explanatory drawing showing another example of the constant current generating circuit of FIG. 31.
Figure 33:
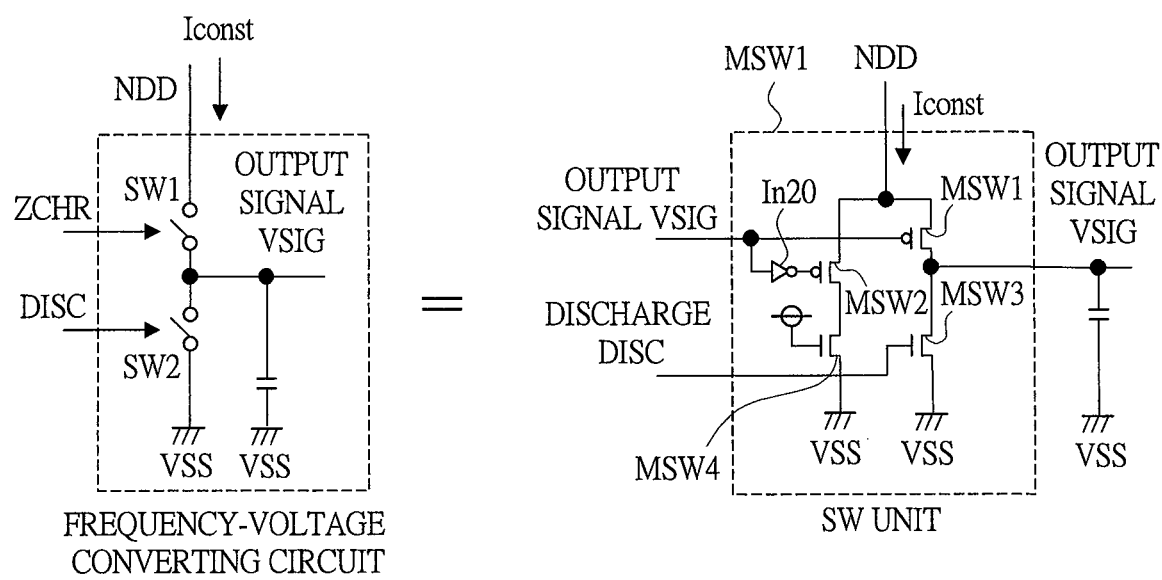
FIG. 33 is an explanatory drawing showing a detailed configuration of the switch unit of the frequency-voltage converting circuit of FIG. 2.
Figure 34:
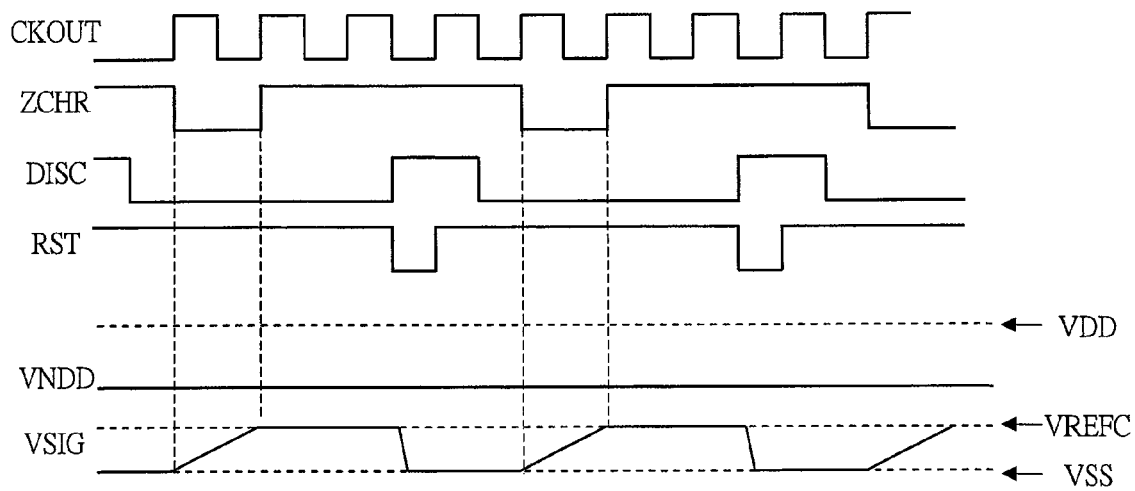
FIG. 34 is a timing chart of a frequency-voltage converting operation in the frequency-voltage converting circuit to which the constant current generating circuit of FIG. 30 is connected.
Figure 35:
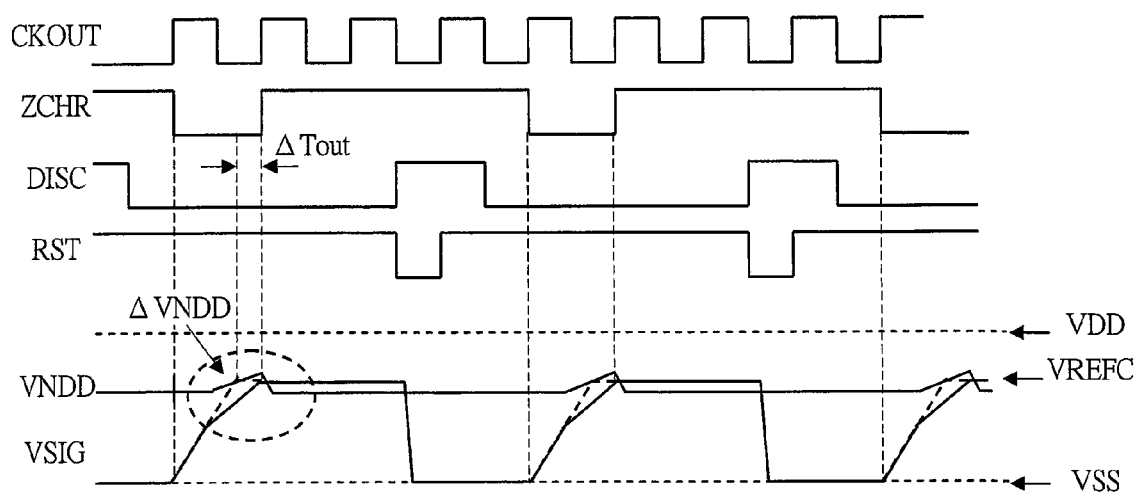
FIG. 35 is a timing chart of a frequency-voltage converting operation in the frequency-voltage converting circuit in a case in which the voltage VNDD is varied.
Figure 36:
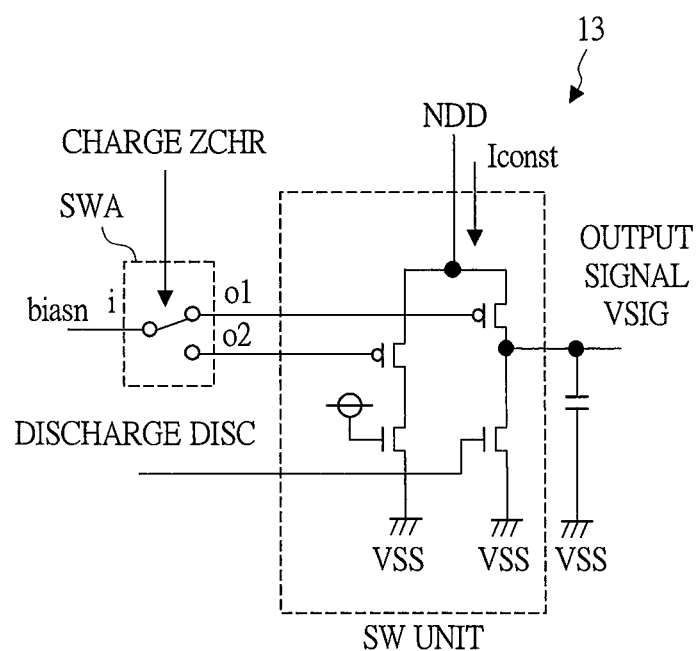
FIG. 36 is an explanatory drawing showing another example of the frequency-voltage converting circuit of FIG. 33.
Figure 37:
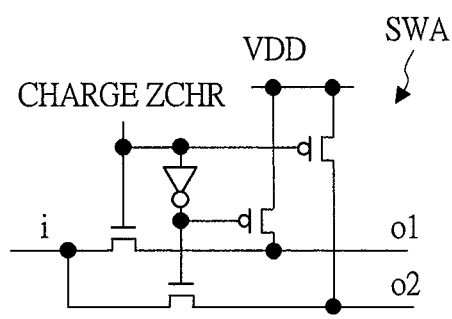
FIG. 37 is an explanatory drawing showing an example of an analog switch used in the frequency-voltage converting circuit of FIG. 36.

FIG. 30 is an explanatory drawing showing a detailed circuit configuration of the constant current generating circuit according to a second embodiment; FIG. 31 is an explanatory drawing showing an example of a case in which the constant current generating circuit of FIG. 30 has a current switching function; FIG. 32 is an explanatory drawing showing another example of the constant current generating circuit of FIG. 31; FIG. 33 is an explanatory drawing showing a detailed configuration of the switch unit of the frequency-voltage converting circuit of FIG. 2; FIG. 34 is a timing chart of a frequency-voltage converting operation in the frequency-voltage converting circuit to which the constant current generating circuit of FIG. 30 is connected; FIG. 35 is a timing chart of a frequency-voltage converting operation in the frequency-voltage converting circuit in a case in which the voltage VNDD is varied; FIG. 36 is an explanatory drawing showing another example of the frequency-voltage converting circuit of FIG. 33; and FIG. 37 is an explanatory drawing showing an example of an analog switch used in the frequency-voltage converting circuit of FIG. 36.

In the second embodiment, FIG. 30 is an explanatory drawing showing a detailed circuit configuration of the constant current generating circuit 11.

As shown in the drawing, the constant current generating circuit 11 is composed of an operational amplifier AMP1, P-channel MOS transistors MB10, MB20, MC10, and MC20, and a resistor R0.

The reference voltage VREFI is connected to a negative (−) side input terminal of the operational amplifier AMP1 so as to be input thereto, and gates of the transistors MB10 and MB20 are connected to an output part of the operational amplifier AMP1.

The power-supply voltage VDD is connected to one connecting parts of the transistors MB10 and MB20 so as to be supplied thereto. One connecting part of the transistor MC10 is connected to the other connecting part of the transistor MB10, and a positive (+) side input terminal of the operational amplifier AMP1 and one connecting part of the resistor R0 are connected to the other connecting part of the transistor MC10. The reference potential VSS is connected to the other connecting part of the resistor R.

One connecting part of the transistor MC20 is connected to the other connecting part of the transistor MB20. A bias voltage Biasp is supplied to the gates of the transistors MC10 and MC20. The frequency-voltage converting circuit 13 is connected to the other connecting part of the transistor MC20.

The constant current generating circuit 11 applies the reference voltage VREFI to the resistor R by the voltage following action of the reference voltage VREFI of the reference voltage generating circuit 10, thereby generating a current Iref=VREFI/R.

In this case, the constant current generating circuit 11 carries out adjustment so that the reference voltage VREFI has a temperature coefficient equivalent to a primary temperature coefficient owned by the resistor R, and thus, the current Iref becomes a current that has no temperature dependency.

The current Iref is current mirrored by the transistors MB10 and MB20 and output to the frequency-voltage converting circuit 13. In this case, by using the cascode-connected transistors MC10 and MC20, the drain-source voltages Vds of the transistor MB10 and the transistor MB20 are equalized to eliminate the voltage dependency of the current Iconst.

FIG. 31 is an explanatory drawing showing an example of a case in which the constant current generating circuit 11 of FIG. 30 has a current switching function. In the configuration of this case, a selector SEL operated by the control signal SELI of the control circuit 12 and transistors MB30 and MC30 are newly provided in the circuit configuration of FIG. 30, and this is an embodiment using cascode connection.

The power-supply voltage VDD is supplied to one connecting part of the transistor MB30, and one connecting part of the transistor MC30 is connected to the other connecting part of the transistor MB30.

The output part of the operational amplifier AMP1 is connected to the gate of the transistor MB30, and the other connecting part of the transistor MS20 is connected to the other connecting part of MC30.

The selector SEL selects and outputs a signal based on the control signal SELI so that the signal input to the gate of the transistor MC30 is either the power-supply voltage VDD or the bias voltage Biasp.

FIG. 32 shows a configuration in which an operational amplifier AMP4 is newly added to the circuit configuration of FIG. 31, and this is an embodiment using regulated cascode connection. A gate of the transistor MC20 is connected to an output of the operational amplifier AMP4. A connecting part of the transistor MB10 and the transistor MC10 is connected to a negative (−) side input terminal of the operational amplifier AMP4, and a connecting part of the transistor MB20 and the transistor MC20 is connected to a positive (+) side input terminal of the operational amplifier AMP4.

In both of the constant current generating circuits 11 of FIG. 31 and FIG. 32, since the cascode-connected MC30 is used as the transistor whose ON/OFF is controlled by the selector SEL, an effect of preventing deterioration of current accuracy due to the switching can be achieved. This can be easily understood if the case in which the selector SEL is inserted between the gate of the transistor MB30 and AMP1 without cascode connection is considered.

In that case, the drain voltage of the transistor MB10 is the voltage VFBCK, the drain voltage of the transistor MB20 and the transistor MB30 is the voltage VNDD, and the drain-source voltages of the transistors MB10, MB20, and MB30 are mutually different. Therefore, there is the possibility that the current ratio between the transistors MB10 and MB20 and the transistor MB30 constituting a current mirror circuit is not proportional to the transistor size.

On the other hand, in the case in which the cascode-connected transistor MC30 is turned ON/OFF by the selector SEL, since the drain-source voltage is equalized by the cascode connection, there is an effect that a current switching function can be realized while maintaining current accuracy.

When the constant current generating circuit 11 has the configuration as described above, the constant current Iconst having no temperature dependency can be generated.

Next, the accuracy of carrying out a frequency-voltage converting operation using the constant current Iconst from the constant current generating circuit 11 and the control signal ZCHR serving as a charge signal is a technical problem. A point to be focused on is that the output of the constant current generating circuit 11 is composed of a P-channel MOS device.

Generally, when high analog accuracy with respect to the variation of the power-supply voltage has to be realized like in an oscillator incorporated in a semiconductor integrated circuit device, basically, the circuit is operated with using the level of a reference potential VSS as a reference.

However, the power-supply voltage VDD is supplied to a substrate of the PMOS device of the constant current generating circuit, and a diffusion capacitance Cp1 is present between the drain, source, and the power-supply voltage VDD. Therefore, a charge amount Cp1·ΔVNDD that is charged to the diffusion capacitance Cp1 has dependency on the power-supply voltage VDD.

Therefore, the frequency-voltage converting circuit has to have a configuration in which nodes such as a node VCS and a node VNDD do not vary without depending on the power supply in order to improve the frequency accuracy.

FIG. 33 is an explanatory drawing showing a detailed configuration of the switch unit of the frequency-voltage converting circuit 13 shown in FIG. 2.

As shown in the drawing, the switch unit of the frequency-voltage converting circuit 13 is composed of transistors MSW1 and MSW2 constituting the switch SW1, an inverter Iv20, and transistors MSW3 and MSW4 constituting the switch SW2.

The operation of the transistors MSW1 and MSW2 is controlled by the control signal ZCHR and the transistors MSW1 and MSW2 operate as a current switch which switches the flow of the current Iconst. The reason for employing the configuration of the current switch is to prevent variation of the voltage VNDD caused when a path for flowing the current Iconst disappears when the switch SW1 is off. In this case, the sizes and device types of the transistor MSW1 and the transistor MSW2 are the same.

In order to prevent variation of the voltage VNDD, the saturation operation of the transistor MSW1 in a charging process is required. According to the conditions of the saturation operation of the transistor MSW1, a design expression (Expression (7)) about the voltage level of the voltage VSIG, that is, the level of the reference voltage VREFC can be established.

[Expression 8]

$$V_{NDD} - Vthp\_msw1 < V_{NDD} - VSIG = Vov\_msw1$$

$$V_{NDD} - Vthp\_msw1 < V_{NDD} - VREFC$$

$$Vthp\_msw1 > VREFC \qquad \text{Expression (7)}$$

Here, Vthp_msw1 is a threshold voltage of the transistor MSW1, Vov_msw1 is a voltage obtained by subtracting Vthp_msw1 from the voltage VNDD, and a condition that the drain-source voltage of the transistor MSW1 is higher than Vov_msw1 is a saturation operation condition of the transistor MSW1.

According to Expressions (7), it can be understood that, when the voltage VREFC is smaller than Vthp_msw1, a potential difference between the VSIG potential and the VNDD potential can be ensured as a result, and the saturation operation condition of the transistor MSW1 can be satisfied. Therefore, it is important in the present embodiment to set the voltage VREFC to be smaller than the threshold voltage Vthp_msw1 of the transistor MSW1.

FIG. 34 is a timing chart of the frequency-voltage converting operation in the frequency-voltage converting circuit 13. When the design expressions (7) are satisfied, the transistor MSW1 operates in a saturation region, and the power supply VNDD can be maintained at a constant voltage during the frequency-voltage converting operation.

On the other hand, FIG. 35 shows waveforms of the case in which the design expressions (7) are not satisfied. As shown in the drawing, in the process of the charge operation by the control signal ZCHR, the transistor MSW1 enters an unsaturated operation, and the voltage level of the power supply VNDD is varied along with the increase of the voltage VSIG. As a result, since ΔQ=Cp1·ΔVNDD is varied depending on power-supply and temperature conditions, frequency accuracy is deteriorated.

FIG. 36 is an explanatory drawing showing another example of the frequency-voltage converting circuit 13 of FIG. 33.

In the circuit configuration of FIG. 33, 1 (Hi) or 0 (Lo) CMOS level is applied to the gates of the transistors MSW1 and MSW2. When the design expressions (7) are satisfied, the gate voltages of the transistors MSW1 and MSW2 are not always required to be CMOS signals. For example, a bias signal biasn may be applied to the transistors MSW1 and MSW2 by an analog switch SWA as shown in FIG. 37.

Third Embodiment

Figure 38:
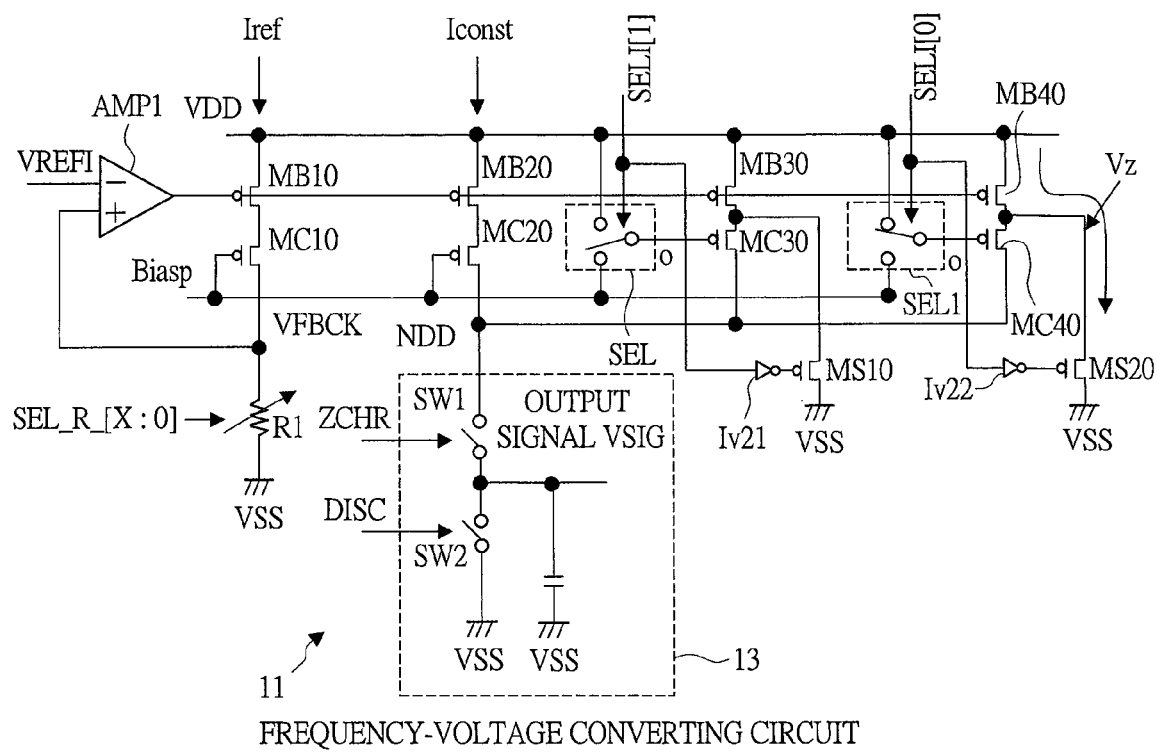
FIG. 38 is an explanatory drawing showing an example of the constant current generating circuit according to a third embodiment of the present invention.
Figure 39:
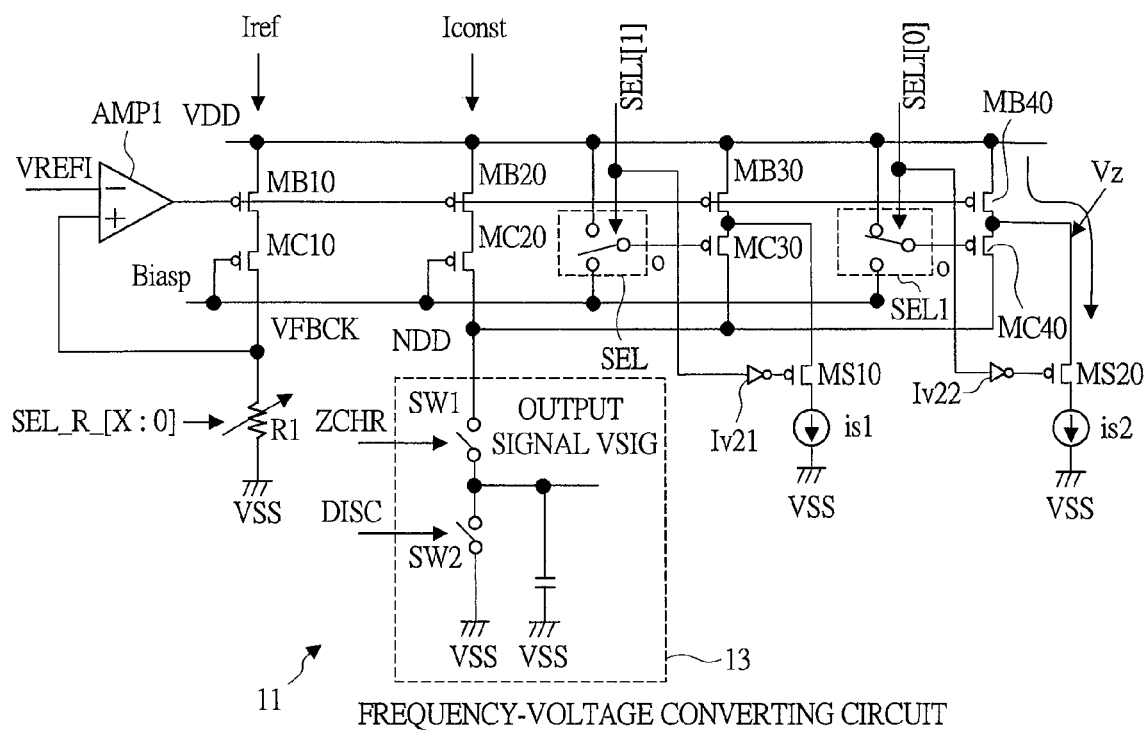
FIG. 39 is an explanatory drawing showing another example of the constant current generating circuit of FIG. 38.

FIG. 38 is an explanatory drawing showing an example of the constant current generating circuit according to a third embodiment of the present invention, and FIG. 39 is an explanatory drawing showing another example of the constant current generating circuit of FIG. 38.

In the third embodiment, FIG. 38 is an explanatory drawing showing an example of the constant current generating circuit 11 having a 2-bit switching function prepared against leakage currents.

As shown in FIG. 8, FIG. 9, FIG. 31, and FIG. 32, when the constant current generating circuit 11 has the frequency switching function, the sub-threshold leakage current Ioff of the non-selected current source shown in Expression (2) causes a problem with respect to frequency accuracy. Since the leakage current has large power-supply and temperature dependency, a device size having a long gate length has to be designed, and a fundamental measure as a circuit has to be taken.

In this case, as shown in the drawing, the constant current generating circuit 11 has a configuration in which P-channel MOS transistors MB40, MC40, MS10, and MS20 and inverters Iv21 and Iv22 are newly added to the circuit configuration of FIG. 33.

In this case, the transistor MS20 which serves as a path for discharging a current when not selected is prepared at a frequency-switching current source. An inversion signal of the control signal SELI output from the control circuit 12 is used as an enable signal of the path for discharging the current.

By discharging the current to the reference potential VSS, a node Vz of FIG. 38 becomes the level of the reference potential VSS, and the transistor MC40 comes in an inversely-biased state. Therefore, the leakage current that flows to the frequency-voltage converting circuit 13 can be suppressed.

FIG. 39 is an explanatory drawing showing another example of the constant current generating circuit 11 of FIG. 38.

In this case, the constant current generating circuit 11 has a configuration in which current sources IS1 and IS2 are provided in the circuit configuration of FIG. 38. When the current sources IS1 and IS2 are provided at the other connecting parts (sources) of the transistors MS10 and MS20, the value of the current discharged to the reference potential VSS can be controlled.

Fourth Embodiment

Figure 40:
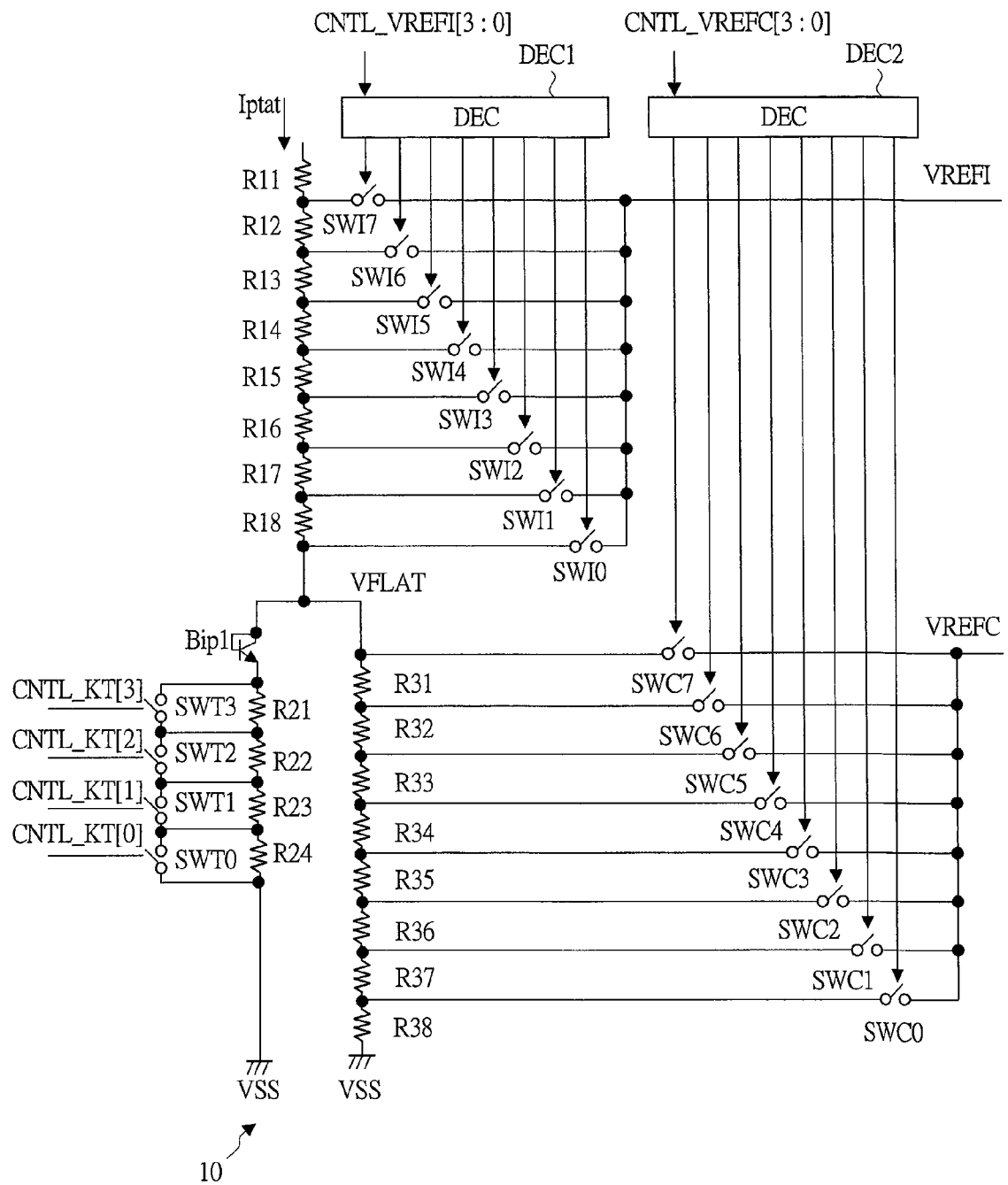
FIG. 40 is an explanatory drawing showing an example of the reference voltage generating circuit according to a fourth embodiment of the present invention.
Figure 41:
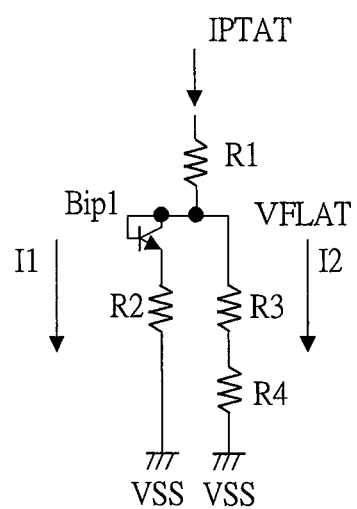
FIG. 41 is a simplified drawing of the reference voltage generating circuit of FIG. 40.
Figure 42:
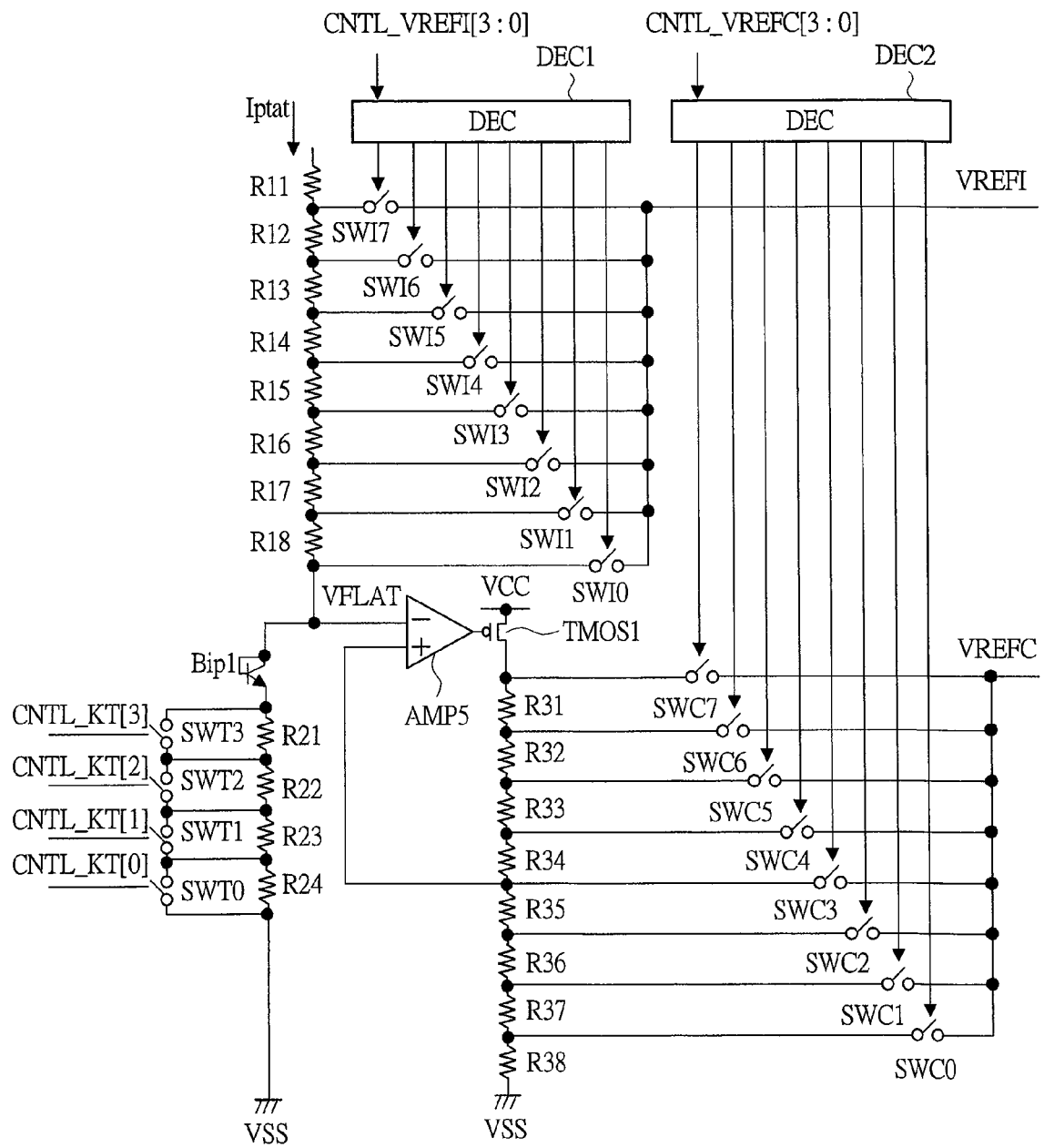
FIG. 42 is an explanatory drawing showing another example of the reference voltage generating circuit of FIG. 40.

FIG. 40 is an explanatory drawing showing an example of the reference voltage generating circuit according to a fourth embodiment of the present invention, FIG. 41 is a simplified drawing of the reference voltage generating circuit of FIG. 40, and FIG. 42 is an explanatory drawing showing another example of the reference voltage generating circuit of FIG. 40.

In the fourth embodiment, FIG. 40 is an explanatory drawing showing an example of a detailed configuration of the reference voltage generating circuit 10 which generates the reference voltages VREFI and VREFC based on 4-bit temperature trimming signals CNTL_VREFI and CNTL_VREFC.

The reference voltage generating circuit 10 is composed of resistors R11 to R18, resistors R21 to R24, resistors R31 to R38, switches SWT0 to SWT3, switches SWI0 to SWI7, switches SWC0 to SWC7, a transistor Bip1 composed of a bipolar element, and decoders DEC1 and DEC2.

The resistors R11 to R18 are connected in series. Between the other connecting part of the resistor R18 and the reference potential VSS, the transistor Bip1 and resistors R21 to R24 connected in series and the resistors R31 to R38 similarly-connected in series are connected in parallel.

Also, a current Iptat which is a PTAT (Proportional To Absolute temperature) current generated by the reference voltage generating circuit 10 is connected to connecting parts of the transistor Bip1 and the resistors R21 to R24 so as to be supplied thereto.

One connecting parts of the switches SWI0 to SWI7 are connected to connecting parts of the resistors R11 to R18, respectively, and the other connecting parts of the switches SWI0 to SWI7 are commonly connected to serve as an output part of the reference voltage VREFI.

One connecting parts of the switches SWC0 to SWC7 are connected to connecting parts of the resistors R31 to R38, respectively, and the other connecting parts of the switches SWC0 to SWC7 are commonly connected to serve as an output part of the reference voltage VREFC.

Also, the decoder DEC1 decodes the temperature trimming signal CNTL_VREFI and turns on any of the arbitrary switches SWI0 to SWI7. The decoder DEC2 decodes the temperature trimming signal CNTL_VREFC and turns on any of the arbitrary switches SWC0 to SWC7.

Operation will be described with reference to the simplified drawing of FIG. 41. A voltage VFLAT having no temperature dependency is expressed as Expression (8) and is realized by cancelling out the temperature dependency of the base-emitter voltage Vbe of the bipolar transistor Bip1 by the temperature dependency provided by the product of the current Iptat and the resistor R2 based on the control signal CNTL_KT.

The reference voltage VREFC is realized by the resistance dividing of the voltage VFAT having no temperature dependency as shown in Expression (9), and the output level thereof is controlled by the temperature trimming signal CNTL_VREFC.

The output level and temperature characteristic of the reference voltage VREFI are adjusted by the temperature trimming signal CNTL_VREFI so as to cancel out the temperature characteristic of the resistor of the constant current generating circuit by the product of the resistor R1 and the current Iptat as shown in Expression (10).

[Expression 9]

$$I_{PTAT} = I_1 + I_2$$
$$V_{FLAT} = (R_3 + R_4) \cdot I_2$$
$$V_{FLAT} = Vbe + R_2 \cdot I_1$$
$$I_1 = I_{PTAT} - I_2$$
$$V_{FLAT} = Vbe + R_2 \cdot (I_{PTAT} - I_2)$$
$$Vbe + R_2 \cdot (I_{PTAT} - I_2) = (R_3 + R_4) \cdot I_2$$
$$I_2 = \frac{Vbe + R_2 \cdot I_{PTAT}}{R_2 + R_3 + R_4}$$
$$V_{FLAT} = \left(\frac{R_3 + R_4}{R_2 + R_3 + R_4}\right) \cdot (Vbe + R_2 \cdot I_{PTAT})$$

Expression (8)

VREFC is expressed by $$VREFC = \left(\frac{R_4}{R_2 + R_3 + R_4}\right)(Vbe + R_2 \cdot I_{PTAT})$$

Expression (9)

VREFI is expressed by $$VREFI = V_{FLAT} + R_1 \cdot I_{PTAT}$$

Expression (10)

$$VREFI =$$

-continued $$\left(\frac{R_3 + R_4}{R_2 + R_3 + R_4}\right) \cdot (Vbe + R_2 \cdot I_{PTAT}) + R_1 \cdot I_{PTAT}$$

A characteristic of the circuit shown in FIG. 40 lies in a point that the resistors R21 to R24 connected in series for controlling temperature characteristic are connected to the emitter of the transistor Bip1 of the bipolar element. A bandgap reference circuit also has a similar circuit configuration, but resistors connected in series are normally connected to the collector of the transistor Bip1 of the bipolar element in general. This is because the temperature dependency of the output voltage of the bandgap reference circuit has to be controlled to be positive and also negative.

However, due to a substrate bias effect of a transistor used for a shunt switch for the connection to the collector of the transistor Bip1, the ON resistance thereof is increased, and the temperature dependency of this ON resistance cannot be ignored in an oscillator incorporated in a semiconductor integrated circuit device in which frequency variation has to be suppressed to ±1%.

In the oscillator unit 2, since the control of positive/negative temperature dependency is not required in the voltage VFLAT (FIG. 40), the resistors R21 to R24 are connected on the emitter side of the transistor Bip1 to take a measure for the substrate bias effect so that the ON resistance does not affect frequency accuracy.

Through the above-described operation, the reference voltage VREFI having temperature dependency and the reference voltage VREFC having no temperature dependency can be generated by the same generation path.

FIG. 42 is an explanatory drawing showing another example of the reference voltage generating circuit 10 of FIG. 40.

In the reference voltage generating circuit 10, an operational amplifier AMP5 and a P-channel MOS transistor TMOS1 are newly added to the circuit configuration of FIG. 40. In the circuit configuration shown in FIG. 40, since the voltage VFLAT is output after voltage dividing, a voltage level equal to or higher than the voltage VFLAT cannot be generated.

Therefore, as shown in the configuration of FIG. 42, the voltage VFLAT is connected to a midpoint of resistors R31 to R38, which are connected in series, in a voltage follower circuit of the operational amplifier AMP5. In this manner, a voltage level equal to or higher than the voltage VFLAT having no power-supply and temperature dependency can be generated.

In the foregoing, the invention made by the inventors of the present invention has been concretely described based on the embodiments. However, it is needless to say that the present invention is not limited to the foregoing embodiments and various modifications and alterations can be made within the scope of the present invention.

Figure 43:
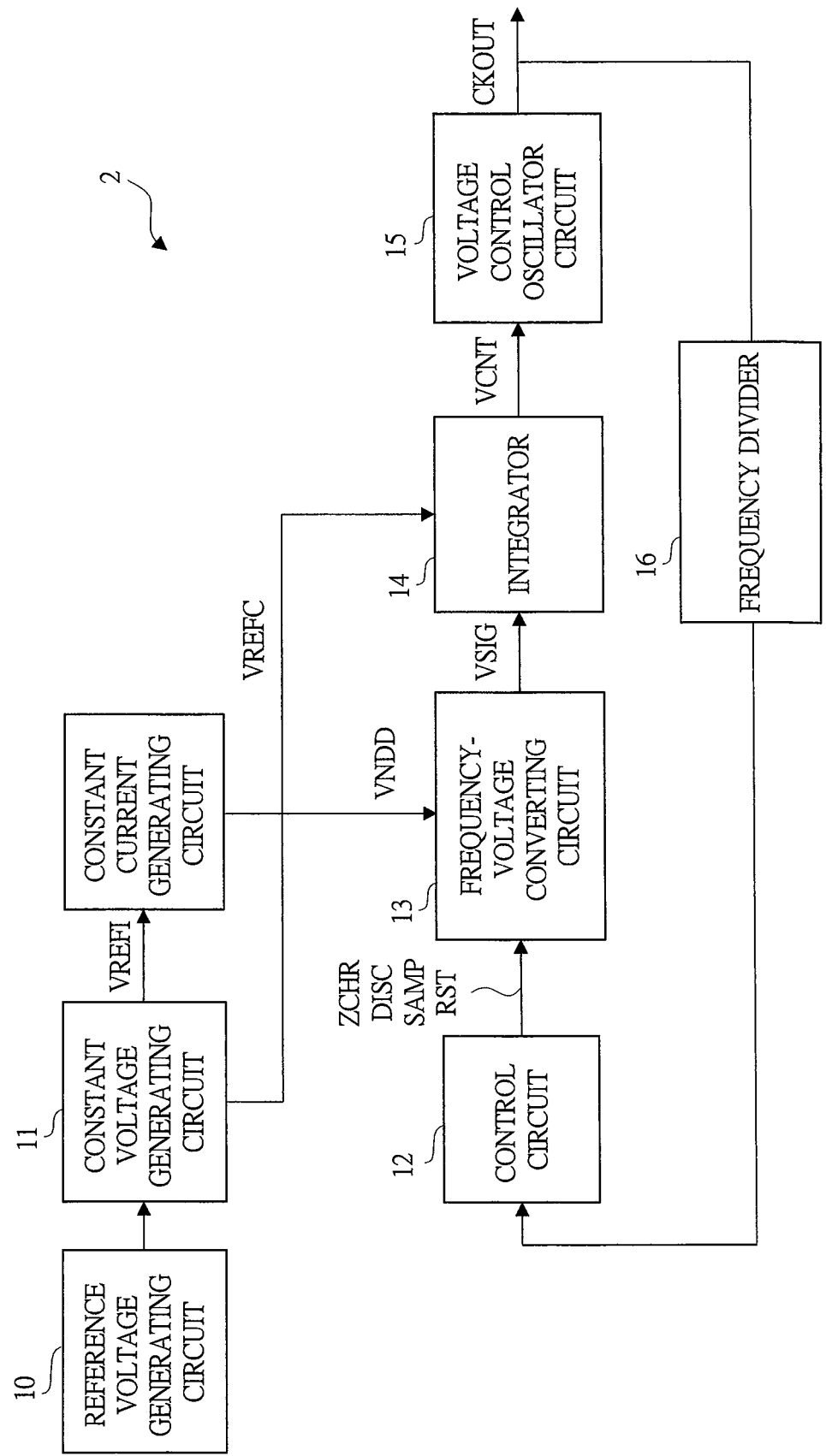
FIG. 43 is a block diagram showing a configuration example of an oscillator unit according to another embodiment of the present invention.
Figure 44:
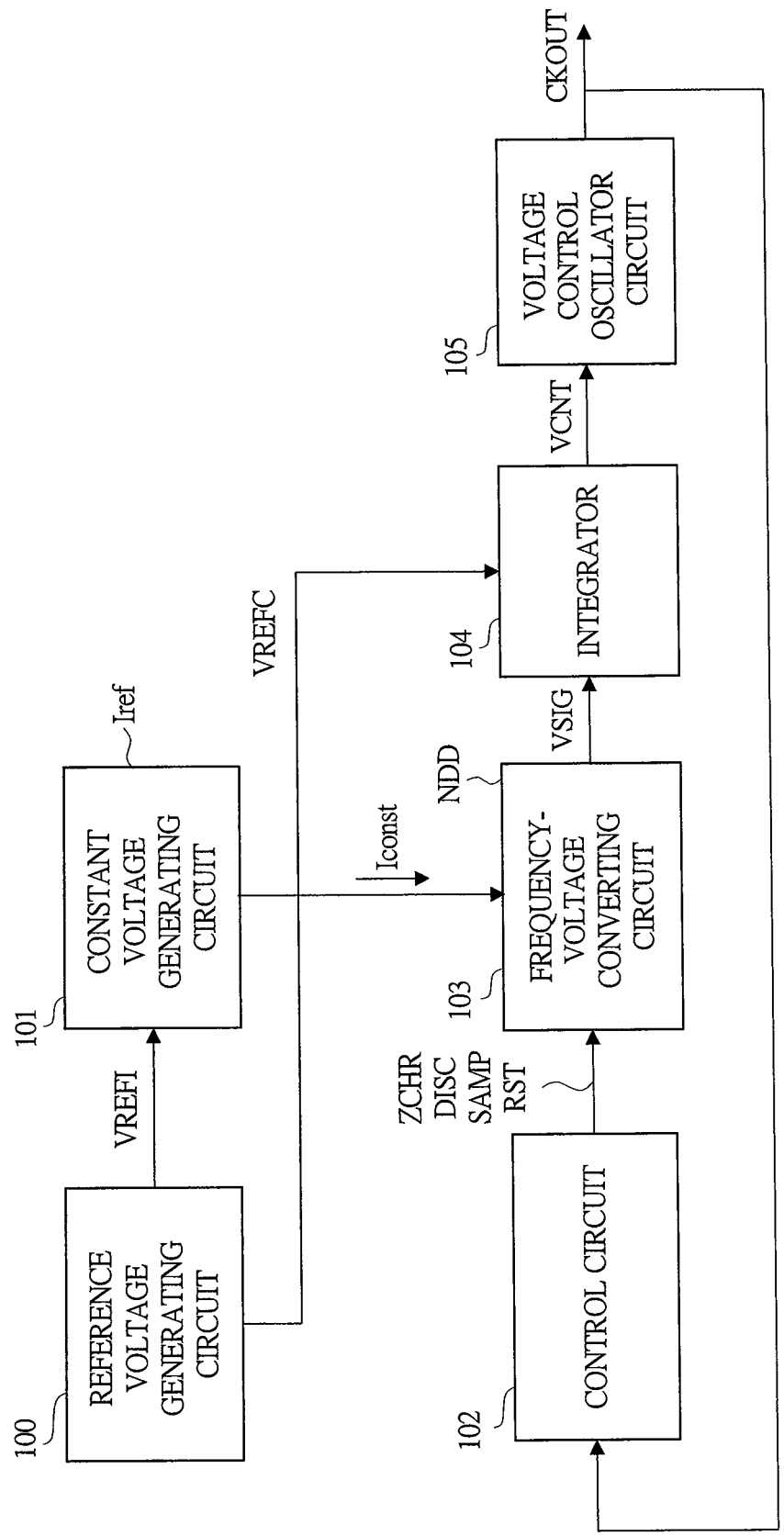
FIG. 44 is a block diagram describing a basic configuration of an oscillator studied by the inventors of the present invention.

The above-described embodiments have shown examples in which the oscillator unit 2 is composed of the reference voltage generating circuit 10, the constant current generating circuit 11, the control circuit 12, the frequency-voltage converting circuit 13, the integrating circuit 14, and the voltage control oscillator circuit 15. However, for example, as shown in FIG. 43, a frequency divider 16 may be newly provided between the control circuit 12 and the voltage control oscillator circuit 15.

As a result of providing the frequency divider 16, control of the oscillator unit 2 is carried out for the cycle of the frequency-divided clock signal CKOUT, and higher frequency of the clock signal CKOUT can be realized without making the frequency of the circuit operation higher.

INDUSTRIAL APPLICABILITY

The present invention is suitable for techniques of generating high-precision clock signals in a semiconductor integrated circuit device provided with an oscillator circuit which internally generates operation clocks.

What is claimed is:

1. A semiconductor integrated circuit device comprising:
a clock oscillating unit,
the clock oscillating unit including:
a voltage control oscillator circuit that generates a clock signal based on a control voltage;
a reference voltage generating circuit that generates a first reference voltage having temperature dependency and a second reference voltage having almost no power-supply and temperature dependency;
a reference current generating circuit that generates a reference current having almost no power-supply and temperature dependency by using the first reference voltage generated by the reference voltage generating circuit;
a frequency-voltage converting circuit that converts an oscillation frequency of the clock signal generated by the voltage control oscillator circuit to a voltage by using the reference current generated by the reference current generating circuit; and
an integrating circuit that integrates the voltage output from the frequency-voltage converting circuit and generates the control voltage output to the voltage control oscillator circuit, and
the frequency-voltage converting circuit including:
first to Nth electrostatic capacitive units;
a capacitor selecting unit that selects at least one of the second to Nth electrostatic capacitive units based on a select signal; and
a switch unit that charges/discharges the first electrostatic capacitive unit and the electrostatic capacitive unit selected by the switch unit with the reference current based on a charge signal and a discharge signal.

2. The semiconductor integrated circuit device according to claim 1,
wherein the second to Nth electrostatic capacitive units are composed of electrostatic capacitive elements having mutually different electrostatic capacitance values, respectively.

3. The semiconductor integrated circuit device according to claim 1,
wherein the second to Nth electrostatic capacitive units are configured to have a mutually different number of electrostatic capacitive elements having approximately the same electrostatic capacitance value.

4. The semiconductor integrated circuit device according to claim 1,
wherein the switch unit is composed of:
a first switch having one connecting part to which the reference current is supplied; and
a second switch having one connecting part to which the other connecting part of the first switch is connected and having the other connecting part to which a reference potential is connected,
the capacitor selecting unit is composed of:
a plurality of capacitor selecting switches having one connecting parts to which a connecting part of the first switch and the second switch is connected and having the other connecting parts to which one connecting parts of the second to Nth electrostatic capacitive units are connected, respectively,
the first electrostatic capacitive unit is configured to have one connecting part to which the connecting part of the first switch and the second switch is connected and have the other connecting part to which the reference potential is connected, and
the reference potential is connected to the other connecting parts of the second to Nth electrostatic capacitive units.

5. The semiconductor integrated circuit device according to claim 4,
wherein the capacitor selecting switch is composed of two transistors connected in series.

6. The semiconductor integrated circuit device according to claim 1,
wherein the switch unit is composed of:
a first switch having one connecting part to which the reference current is supplied; and
a second switch having one connecting part to which the other connecting part of the first switch is connected and having the other connecting part to which a reference potential is connected,
the first to Nth electrostatic capacitive units have one connecting parts to which a connecting part of the first switch and the second switch is connected,
the capacitor selecting unit is composed of a plurality of capacitor selecting switches having one connecting parts to which one connecting parts of the second to Nth electrostatic capacitive units are connected, respectively, and having the other connecting parts to which the reference potential is connected, and
the other connecting part of the first electrostatic capacitive unit is connected to the reference potential.

7. The semiconductor integrated circuit device according to claim 6,
wherein the capacitor selecting unit has a reset unit that turns on the capacitor selecting switch, which is not selected, for an arbitrary period based on a reset signal when the discharge signal is output.

8. The semiconductor integrated circuit device according to claim 5,
wherein the capacitor selecting switch is composed of two transistors connected in series.

9. The semiconductor integrated circuit device according to claim 1,
wherein the capacitor selecting unit and the switch unit are disposed on a side of a first side of the first to Nth electrostatic capacitive units or on a side of a second side opposed to the first side.

10. The semiconductor integrated circuit device according to claim 1,
wherein the reference current generating circuit includes:
a first transistor having one connecting part to which a power-supply voltage is connected;
a first voltage dependency reducing transistor having one connecting part to which the other connecting part of the first transistor is connected;
a resistor having one connecting part to which the other connecting part of the first voltage dependency reducing transistor is connected and having the other connecting part to which the reference potential is connected;
an operational amplifier that uses the reference voltage as an input voltage and constitutes a voltage follower circuit together with the first transistor and the first voltage dependency reducing transistor;

second to Nth transistors constituting a current mirror circuit together with the first transistor;

second to the Nth voltage dependency reducing transistors connected in series to the second to Nth transistors, respectively and having mutally different transistor sizes;

a transistor selecting unit that selects and turns on at least one of the second to Nth voltage dependency reducing transistors based on a transistor unit select signal, thereby switching a current mirror ratio; and a leakage current suppressing unit that is connected between a connecting part of the second to the Nth transistors and the second to Nth voltage dependency reducing transistors and the reference potential and discharges the current of the voltage dependency reducing transistor, which is not selected by the transistors selecting unit, to the reference potential.

11. The semiconductor integrated circuit device according to claim 10, wherein the reference current generating circuit includes a current source connected between the leakage current suppressing unit and the reference potential, and the current source controls a value of the current discharged from the leakage current suppressing unit.

12. The semiconductor integrated circuit device according to claim 1, wherein the reference voltage generating circuit includes:

a first resistor unit having one connecting part to which a PTAT current having positive primary temperature dependency is supplied and composed of a plurality of resistors connected in series;

a bipolar transistor having a collector and a base to which the other connecting part of the first resistor unit is connected;

a second resistor unit having one connecting part to which an emitter of the bipolar transistor is connected, having the other connecting part to which the reference potential is connected, and composed of a plurality of resistors connected in series;

a third resistor unit having one connecting part to which the other connecting part of the first resistor unit is connected, having the other connecting part to which the reference potential is connected, and composed of a plurality of resistors connected in series;

a first selecting unit that selects an arbitrary connecting part of the first resistor unit based on a first temperature trimming signal and outputs as the first reference voltage;

a second selecting unit that selects an arbitrary connecting part of the third resistor unit based on a second temperature trimming signal and outputs as the second reference voltage; and an adjustment unit that adjusts a voltage dividing ratio of at the second resistor unit based on an adjustment control signal to cancel out temperature dependency of a base-emitter voltage of the bipolar transistor.

13. The semiconductor integrated circuit device according to claim 1, wherein the reference voltage generating circuit includes:

a first resistor unit having one connecting part to which PTAT current having positive primary temperature dependency is supplied and composed of a plurality of resistors connected in series;

a bipolar transistor having a collector and a base to which the other connecting part of the first resistor unit is connected;

a second resistor unit having one connecting part to which an emitter of the bipolar transistor is connected, having the other connecting part to which the reference potential is connected, and composed of a plurality of resistors connected in series;

a transistor having one connecting part to which the power-supply voltage is connected;

a third resistor unit having one connecting part to which the other connecting part of the transistor is connected, having the other connecting part to which the reference potential is connected, and composed of a plurality of resistors connected in series;

an operational amplifier having a negative-side input terminal to which the collector and base of the bipolar transistor are connected, having a positive-side input terminal to which a midpoint of the third resistor unit is connected, and having an output part to which a gate of the transistor is connected;

a first selecting unit that selects an arbitrary connecting part of the first resistor unit based on a first temperature trimming signal and outputs as the first reference voltage;

a second selecting unit that selects an arbitrary connecting part of the third resistor unit based on a second temperature trimming signal and outputs as the second reference voltage; and an adjustment unit that adjusts a voltage dividing ratio of the second resistor unit based on an adjustment control signal to cancel out temperature dependency of a base-emitter voltage of the bipolar transistor.

* * * * *